United States Patent [19]
Schwartz et al.

[11] Patent Number: 5,815,097
[45] Date of Patent: Sep. 29, 1998

[54] METHOD AND APPARATUS FOR SPATIALLY EMBEDDED CODING

[75] Inventors: Edward L. Schwartz, Sunnyvale; Ahmad Zandi, Cupertino; Tibor Boros, Stanford, all of Calif.

[73] Assignees: Ricoh Co. Ltd., Tokyo, Japan; Ricoh Corporation, Menlo Park, Calif.

[21] Appl. No.: 652,380

[22] Filed: May 23, 1996

[51] Int. Cl.$^6$ .................................................. H03M 7/00
[52] U.S. Cl. .................................................. 341/51
[58] Field of Search ........................ 341/51, 107; 382/232

[56] References Cited

U.S. PATENT DOCUMENTS

| | | | |
|---|---|---|---|
| 4,302,775 | 11/1981 | Widergren et al. | 358/136 |
| 5,471,207 | 11/1995 | Zandi et al. | 341/107 |

OTHER PUBLICATIONS

Majid Rabbani, Paul W. Jones,"Digital Image Compression Techniques", SPIE vol. TT7, 1991, pp. 190–202.

William B. Pennebaker, Joan L. Mltchell, "JPEG Still Image Data Compression Standard", Van Nostrand Reinhold, New York, 1993, p. 208.

Glen G. Langdon, Jr., Chris A. Haidinyak, "Context-Dependent Distribution Shaping and Parameterization for Lossless Image Compression", SPIE vol. 2298, Applications of Digital Image Processing XVII, Jul. 26–29, 1994, San Diego, CA.

Ahmed Zandi, Martin Boliek, Edward L. Schwartz, Alexander Keith, "Compression with Reversible Embedded Wavelets with an Enhanced Binary Mode", submitted to the IEEE on Acoustics, Speech, and Signal Processing, Atlanta, Georgia, May 7, 1996, p. 4.

Ken Knowlton, "Progressive Transmission of Grey–Scale and Binary Pictures by Simple, Efficient, and Lossless Encoding Schemes", Proceedings of the IEEE, vol. 68, No. 7, Jul. 1980, pp. 885–895.

"Digital Compression and Coding of Continuous–Zone Still Images", Appendix A, ISO DIS 10918–1, Requirements and Guidelines, pp. 337 and 457. (no date given).

"Information Technology—Coded Representation of Picture and Audio Information—Progressive Bi–Level Image Compression", ISO/IEC 11544, First Edition, Dec. 15, 1993, pp. viii, xii,6–7.

Paul G. Howard, Jeffrey Scott Vitter, "Fast and Efficient Lossless Image Compression",IEEE, Data Compression Conference, DCC'93, p. 351. (1993).

Limin Wang, Morris Goldberg, "Reduced–Difference Pyramid: A Data Structure for Progressive Image Transmission", Optical Engineering, Jul. 1989, vol. 28, No. 7, pp. 708–712.

Peter J. Burt, Edward H. Adelson, "The Laplacian Pyramid as a Compact Image Code", IEEE Transactions on Communications, vol. COM–31, No. 4, Apr. 1983, pp. 532–540.

P. Roos, M.A. Viergever, M.C.A. Van Duke, J.H. Peters, "Reversible Intraframe Compression of Medical Images", IEEE Transactions on Medical Imaging, vol., 7, No. 4, Dec. 1988, pp. 328–336.

Sharaf E. Elnahas, Kou–hu Tzou, Jerome R. Cox, Jr., Rexford L. Hill, R. Gilbert Jost, "Progressive Coding and Transmission of Digital Diagnostic Pictures", IEEE Transactions on Medical Imaging, vol. MI–5, No. 2, Jun. 1986, pp. 73–83.

*Primary Examiner*—Brian K. Young
*Attorney, Agent, or Firm*—Blakely, Sokoloff, Taylor & Zafman LLP

[57] ABSTRACT

The present invention provides a method and apparatus for compressing and/or decompressing data. In one embodiment, a system comprises a one-pass spatially embedded compressor and a limited bandwidth channel. The compressor comprises image data into compressed image data in one-pass. The compressor comprises an encoder and a coded data manager.

53 Claims, 26 Drawing Sheets

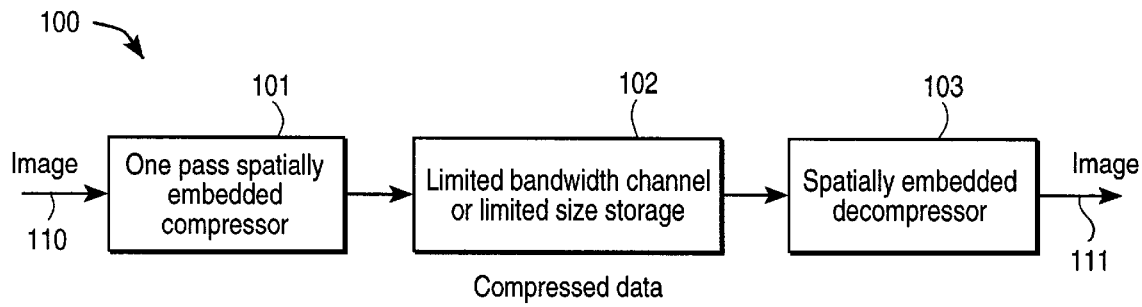
FIG_1
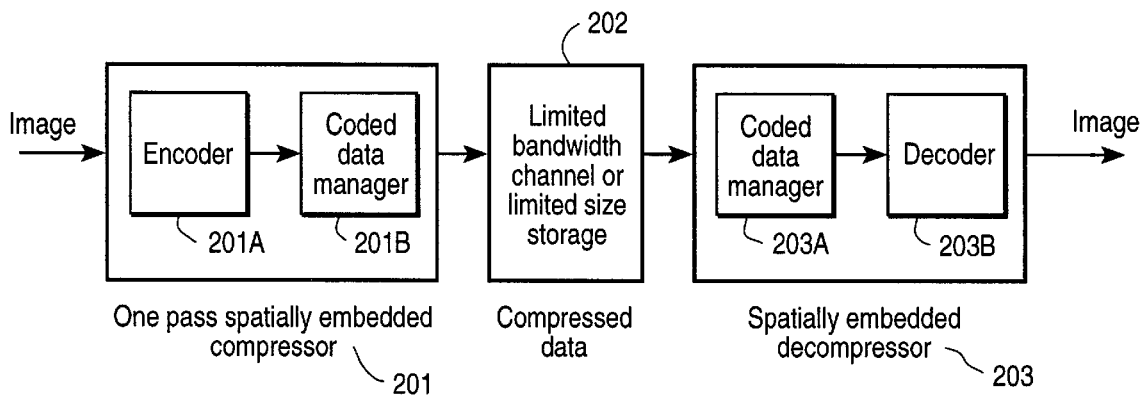
FIG_2
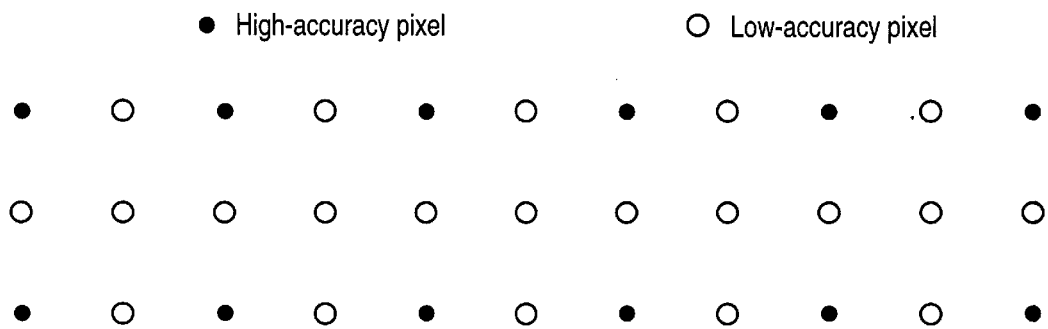
FIG_3

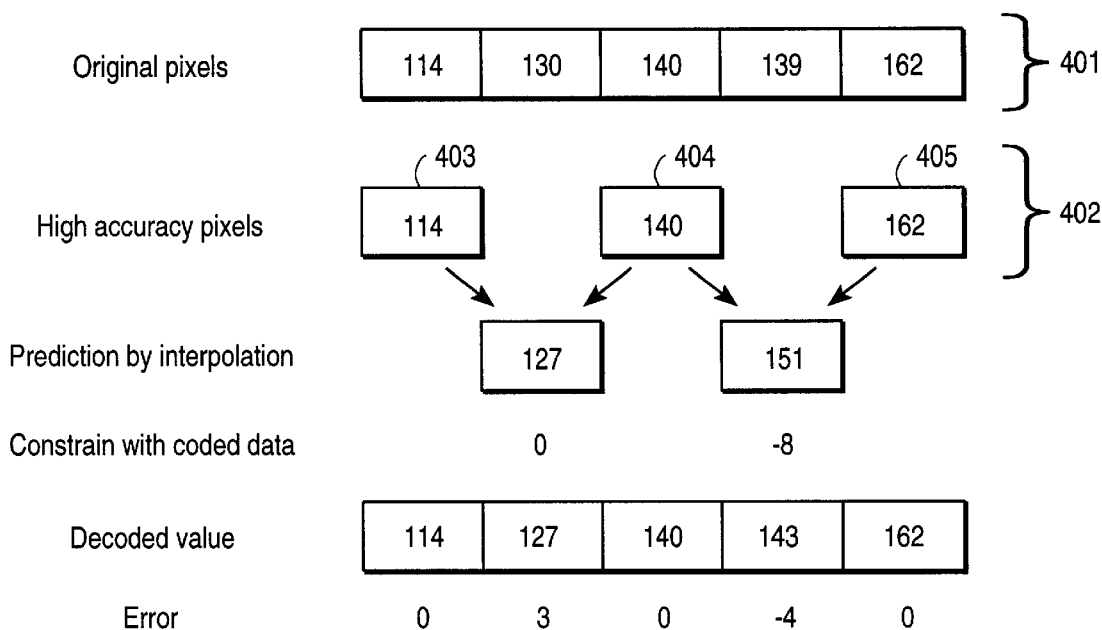
FIG_4
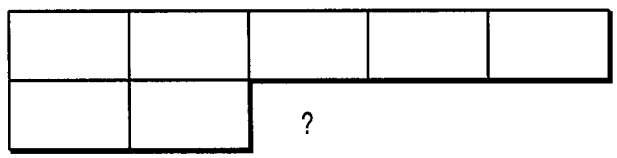
FIG_5A
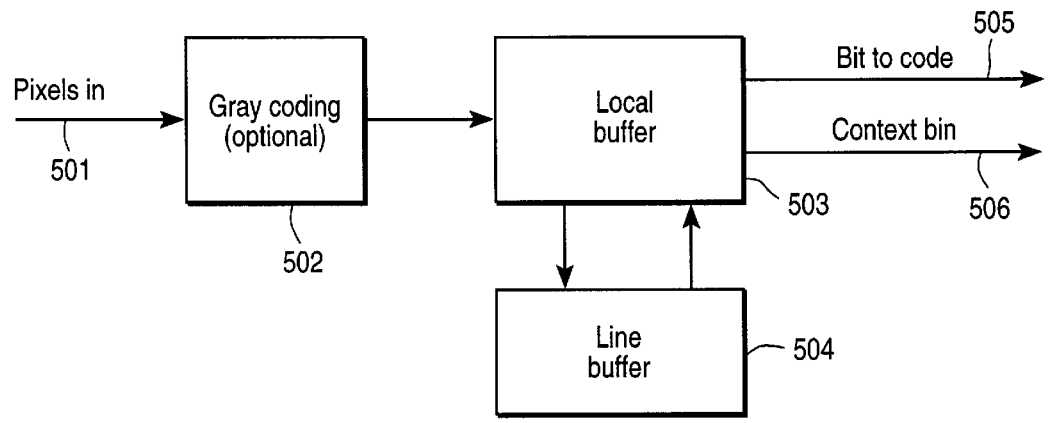
FIG_5B

| High-accuracy (1/4) pixels | |
|---|---|
| Bit | Importance |
| 7 | 0 |
| 6 | |
| 5 | |
| 4 | |
| 3 | |
| 2 | |
| 1 | 1 |
| 0 | 2 |

| Low-accuracy (3/4) pixels | |
|---|---|
| Bit | Importance |
| 7 | 0 |
| 6 | |
| 5 | |
| 4 | 1 |
| 3 | |
| 2 | |
| 1 | 2 |
| 0 | 3 |

FIG_6

| High-accuracy pixels | |
|---|---|
| Bit | Importance |
| 7 | 0 |
| 6 | |
| 5 | |
| 4 | |
| 3 | |
| 2 | |
| 1 | 2 |
| 0 | 4 |

| Low-accuracy pixels | |
|---|---|
| Bit | Importance |
| 7 | 0 |
| 6 | 1 |
| 5 | |
| 4 | |
| 3 | 3 |
| 2 | 5 |
| 1 | 6 |
| 0 | 7 |

FIG_7

```
                20 possible pixels              10 pixels chosen
                                                  out of the 20

. . . . . . . . . . . . . . . .    . . . . . . . . . . . . . . . .
              X . X . X . X . X . X . X . X .    . . . . . . X . X . X . . . . .
              . . . . . . . . . . . . . . . .    . . . . . . . . . . . . . . . .
              X . X . X . X . X . X . X . X .    . . . . X . X . X . X . X . . .
              . . . . . . . . . . . . . . . .    . . . . . . . . . . . . . . . .    (Phase 0)
              X . X . X . X . ? . . . . . . .    . . . . X . X . ? . . . . . . .
              . . . . . . . . . . . . . . . .    . . . . . . . . . . . . . . . .
              . . . . . . . . . . . . . . . .    . . . . . . . . . . . . . . . .

. . . . . . . . . . . . . . . .    . . . . . . . . . . . . . . . .
              . . . . . . . . . . . . . . . .    . . . . . . . . . . . . . . . .
              . . . . . . . X X X . . . . . .    . . . . . . . . . . . . . . . .
              . . . . . . X X X X X X . . . .    . . . . . . . X X X X . . . . .
              . . . . . X X X X ? . . . . . .    . . . . . . . . X X ? . . . . .    (Phase 2)
              . . . . X . X . X . X . X . . .    . . . . . . X . X . X . X . . .
              . . . . . . . . . . . . . . . .    . . . . . . . . . . . . . . . .
              . . . . . . . . . X . X . . . .    . . . . . . . . . . . . . . . .

. . . . . . . . . . . . . . . .    . . . . . . . . . . . . . . . .
              . . . . . . . . . . . . . . . .    . . . . . . . . . . . . . . . .
              . . . . . . . X X X . . . . . .    . . . . . . . . . . . . . . . .
              . . . . . . X X X X X X . . . .    . . . . . . . X X X X . . . . .
              . . . . . X X X X ? . . . . . .    . . . . . . . . X X ? . . . . .    (Phase 1)
              . . . . X . X . X . X . X . . .    . . . . . . X . X . X . X . . .
              . . . . . . . . . . . . . . . .    . . . . . . . . . . . . . . . .
              . . . . . . . . . X . X . . . .    . . . . . . . . . . . . . . . .

. . . . . . . . . . . . . . . .    . . . . . . . . . . . . . . . .
              . . . . . . . . . . . . . . . .    . . . . . . . . . . . . . . . .
              . . . . . . . . . X X X . . . .    . . . . . . . . . . X . . . . .
              . . . . . . . X X X X X X . . .    . . . . . . . . . X X X . . . .
              . . . . . X X X X ? X . X . X .    . . . . . . . . X X ? X . X . .    (Phase 3)
              . . . . . . . . . . . . . . . .    . . . . . . . . . . . . . . . .
              . . . . . . X . X . X . X . . .    . . . . . . . . . X . X . . . .

FIG                              FIG
                    8A                               8B
```

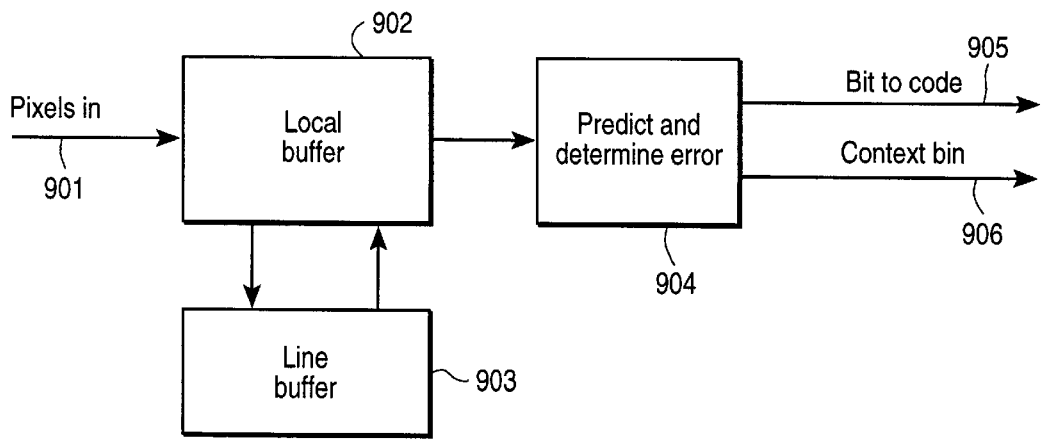
FIG_9
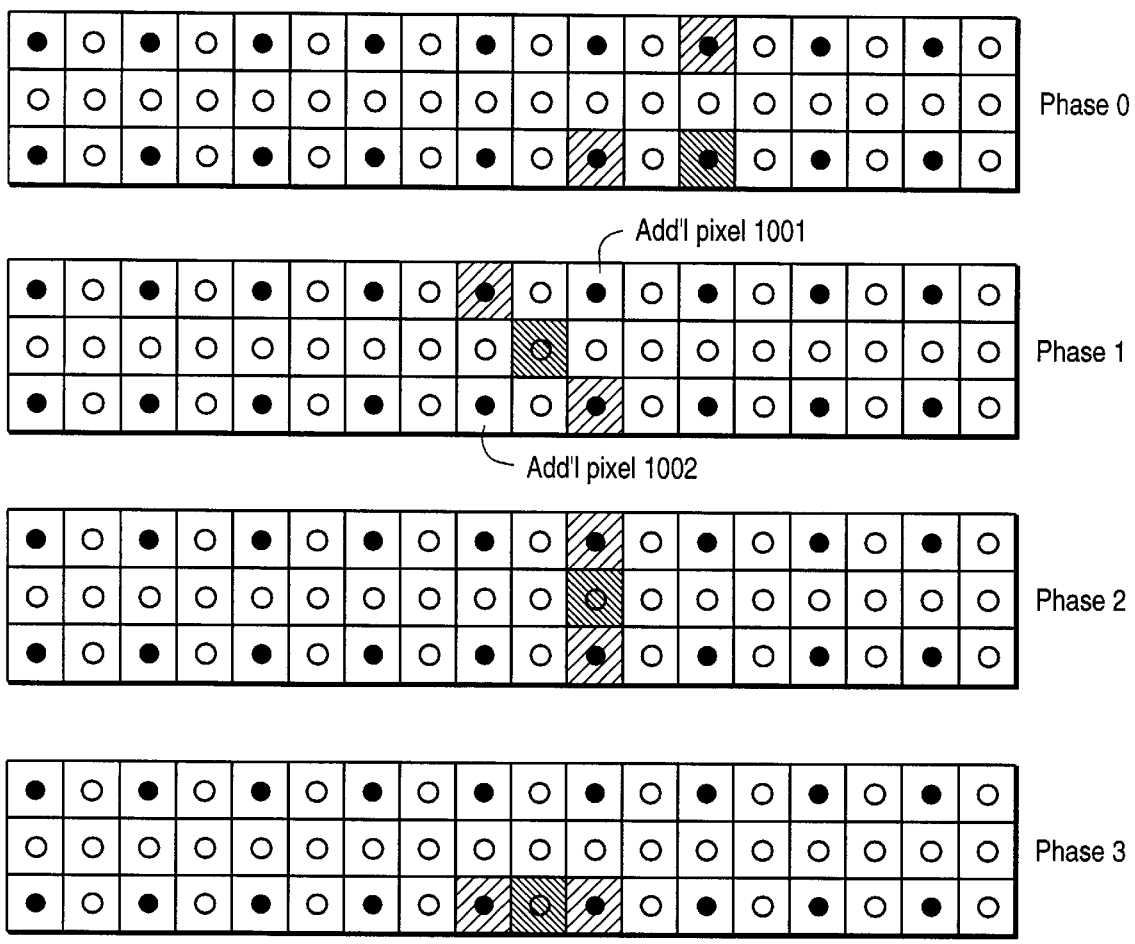
FIG_10

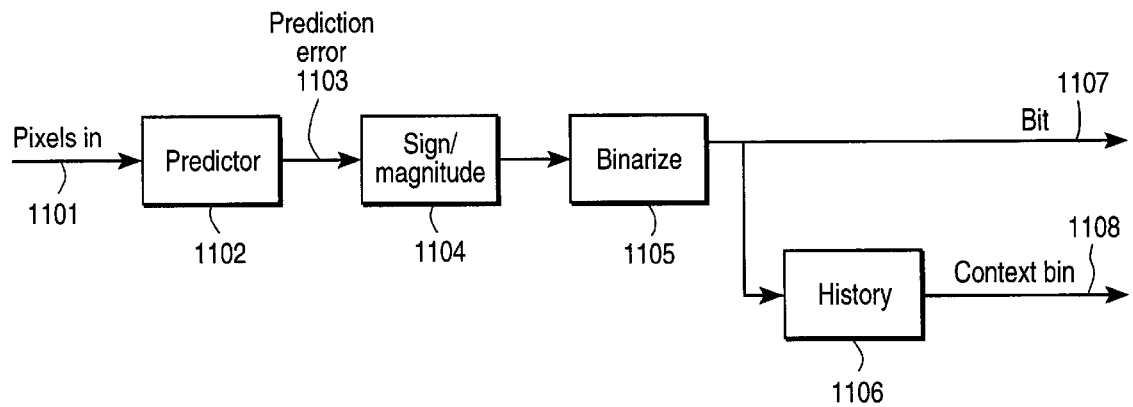
FIG_11
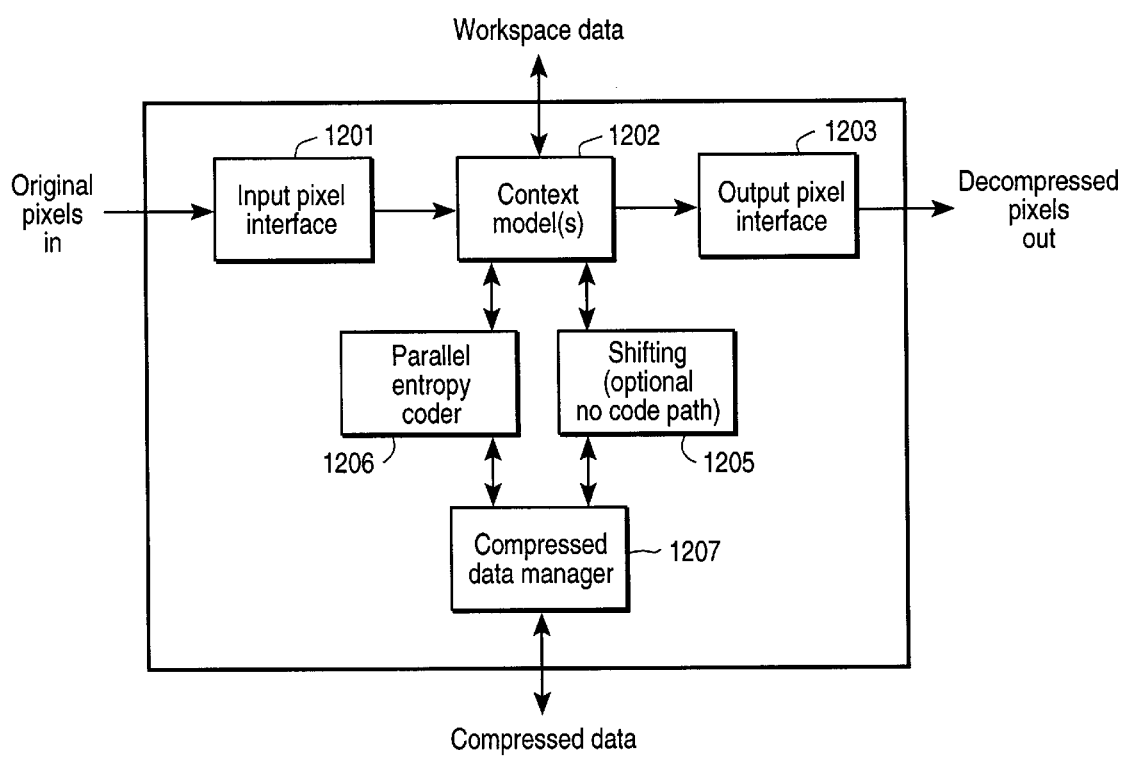
FIG_12

| High-accuracy (1/4) pixels | |
|---|---|
| Data | Importance |
| Magnitude bit 2-3 | |
| Magnitude bit 1 | |
| Magnitude bit 0 | |
| Sign/mantissa bits 6-4 | 0 |
| Sign/mantissa bit 3 | |
| Sign/mantissa bit 2 | |
| Sign/mantissa bit 1 | |
| Sign/mantissa bit 0 | 5 |

| Low-accuracy (3/4) pixels | |
|---|---|
| Data | Importance |
| Magnitude bit 2-3 | 1 |
| Magnitude bit 1 | 1 or 3 |
| Magnitude bit 0 | |
| Sign/mantissa bits 6-4 | 1 |
| Sign/mantissa bit 3 | 2 |
| Sign/mantissa bit 2 | 4 |
| Sign/mantissa bit 1 | 6 |
| Sign/mantissa bit 0 | 7 |

FIG_13

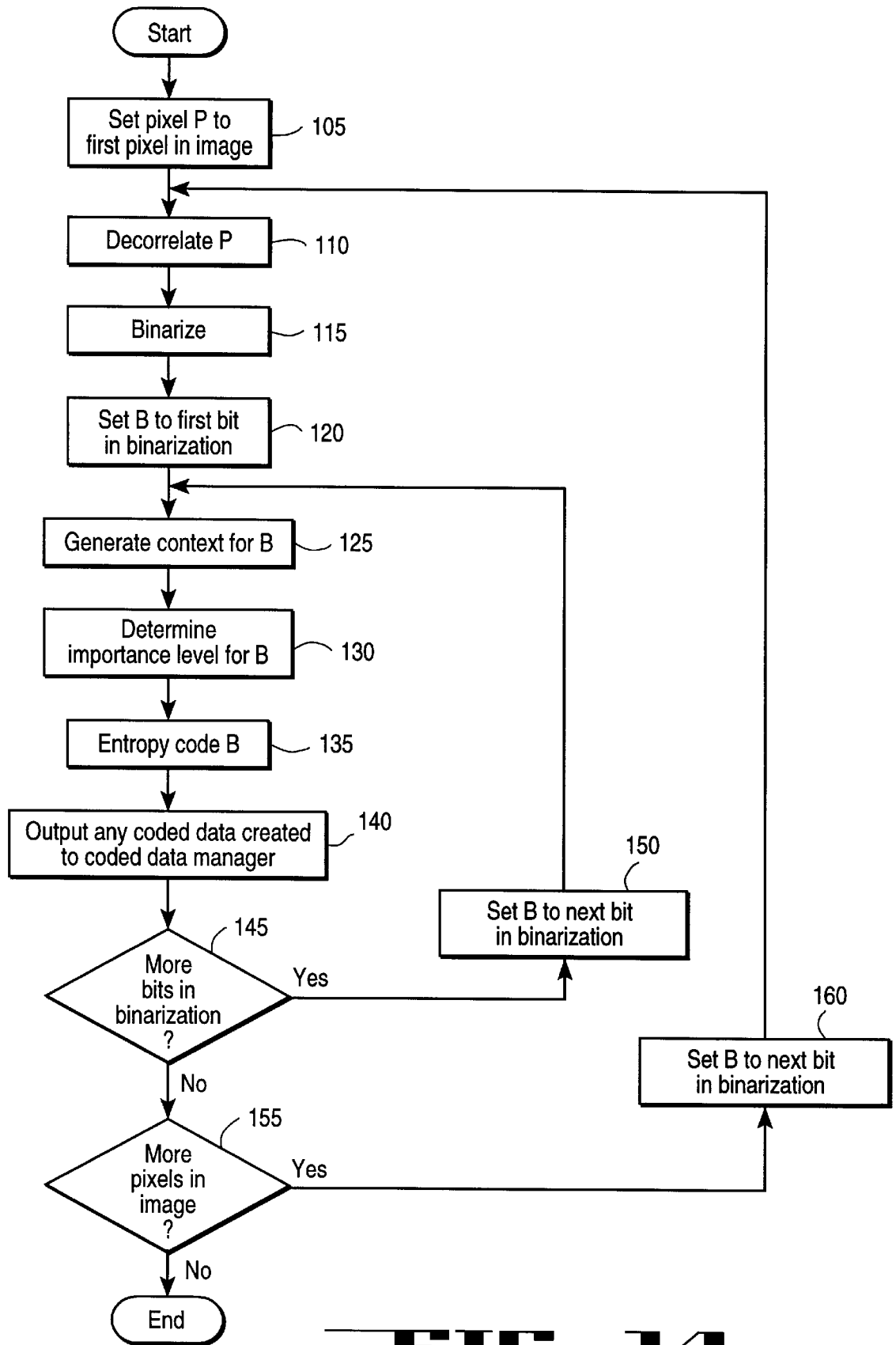
FIG_14

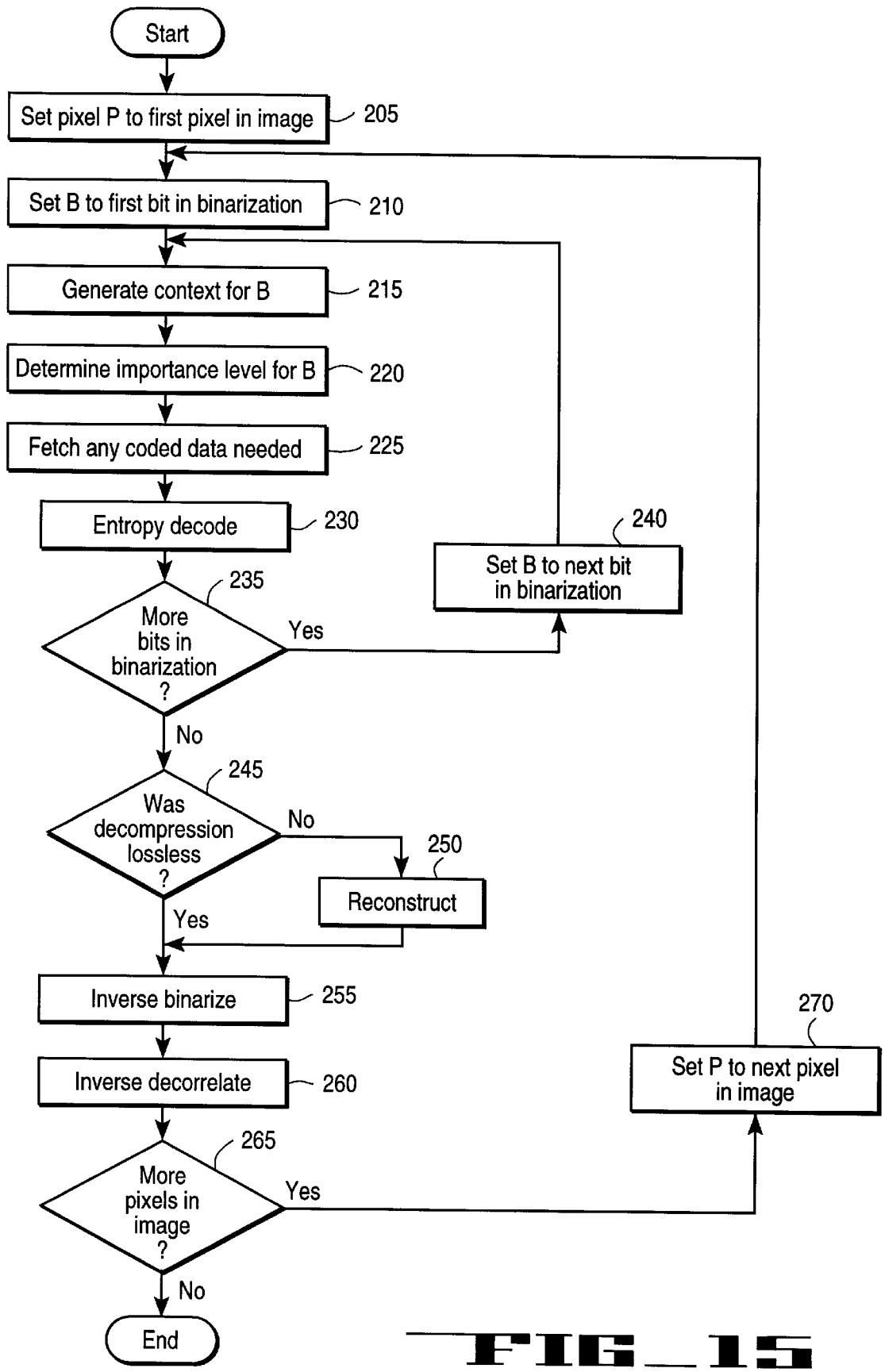
FIG_15

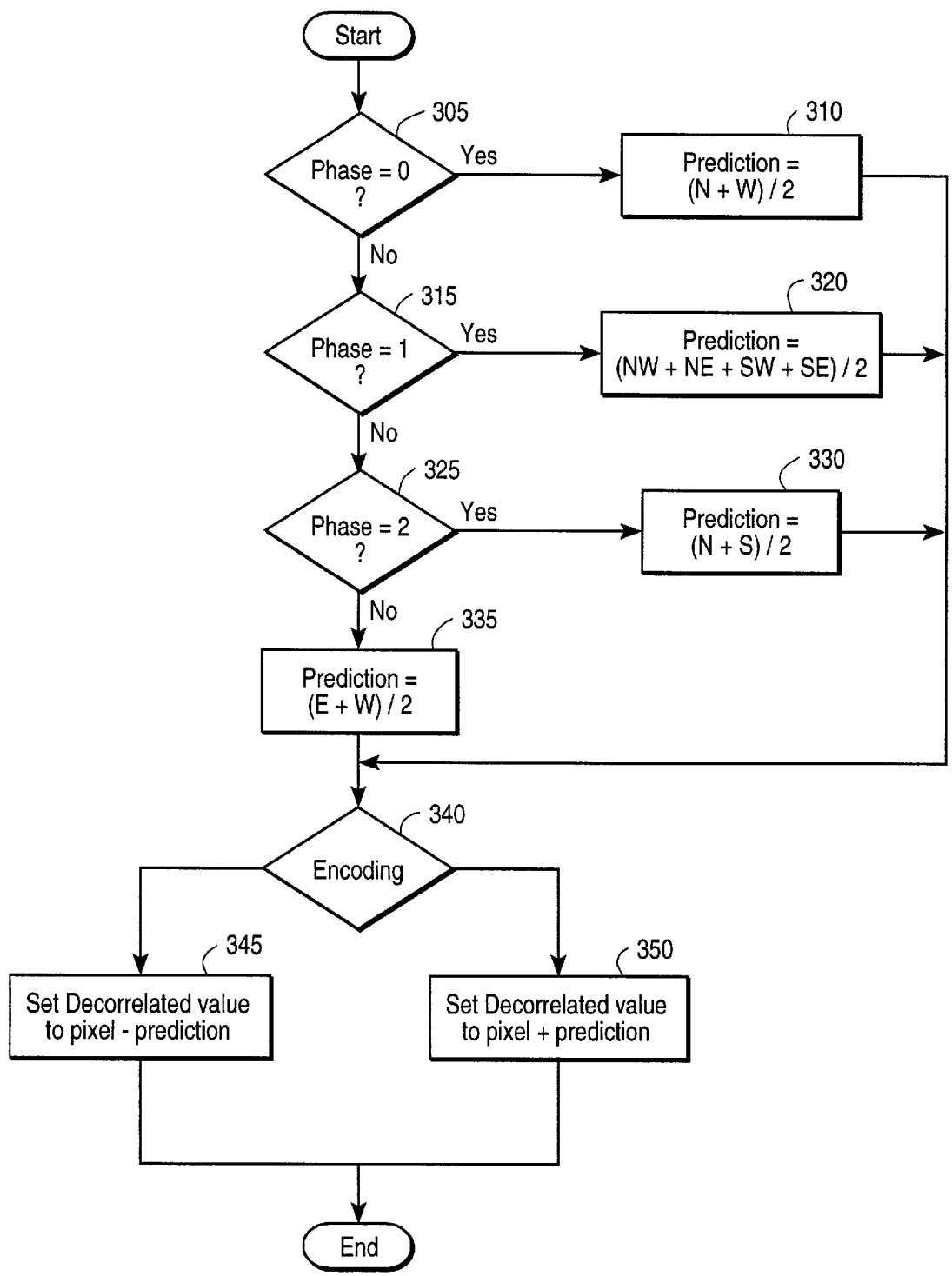
FIG_16

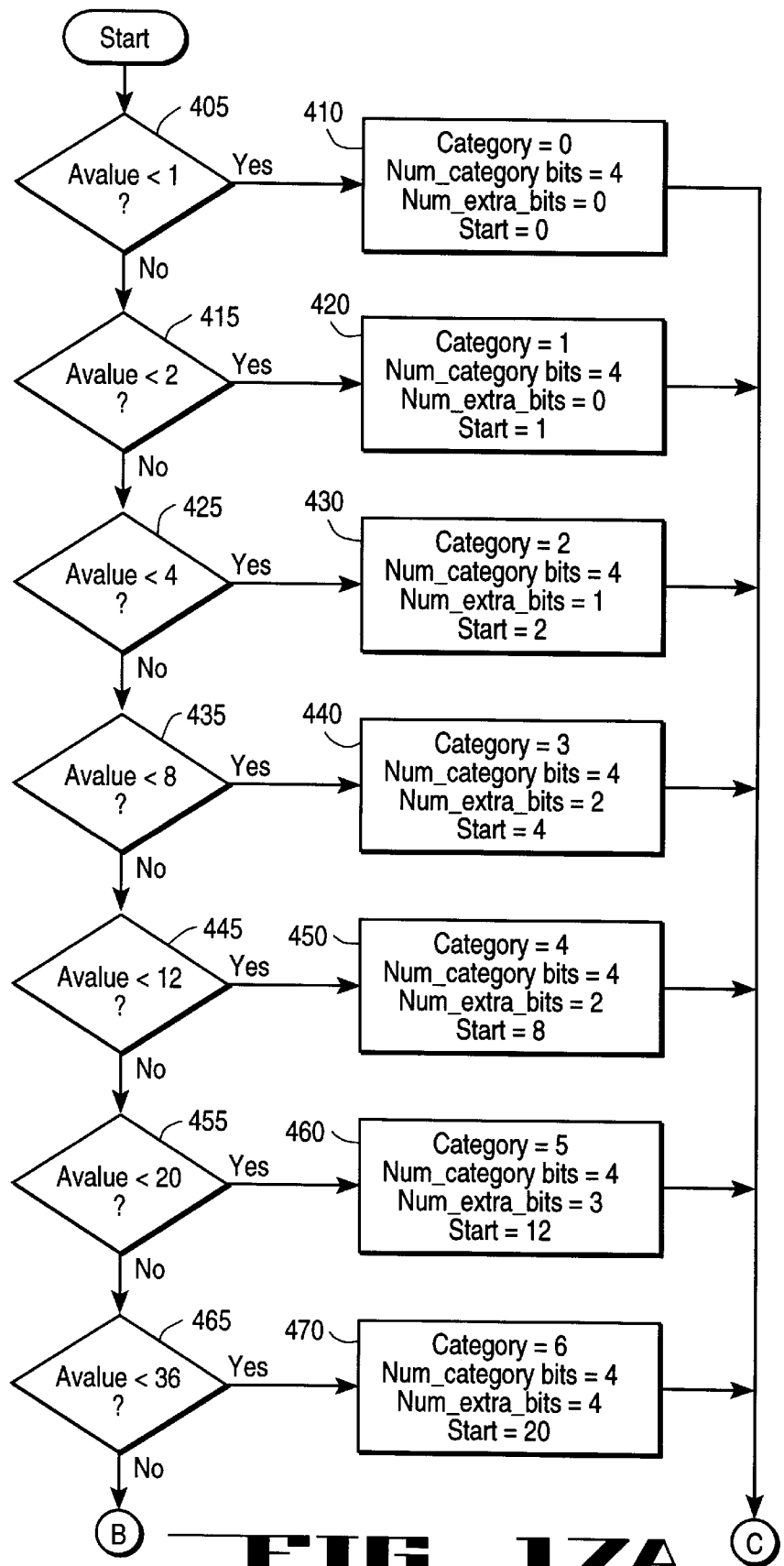
FIG_17A

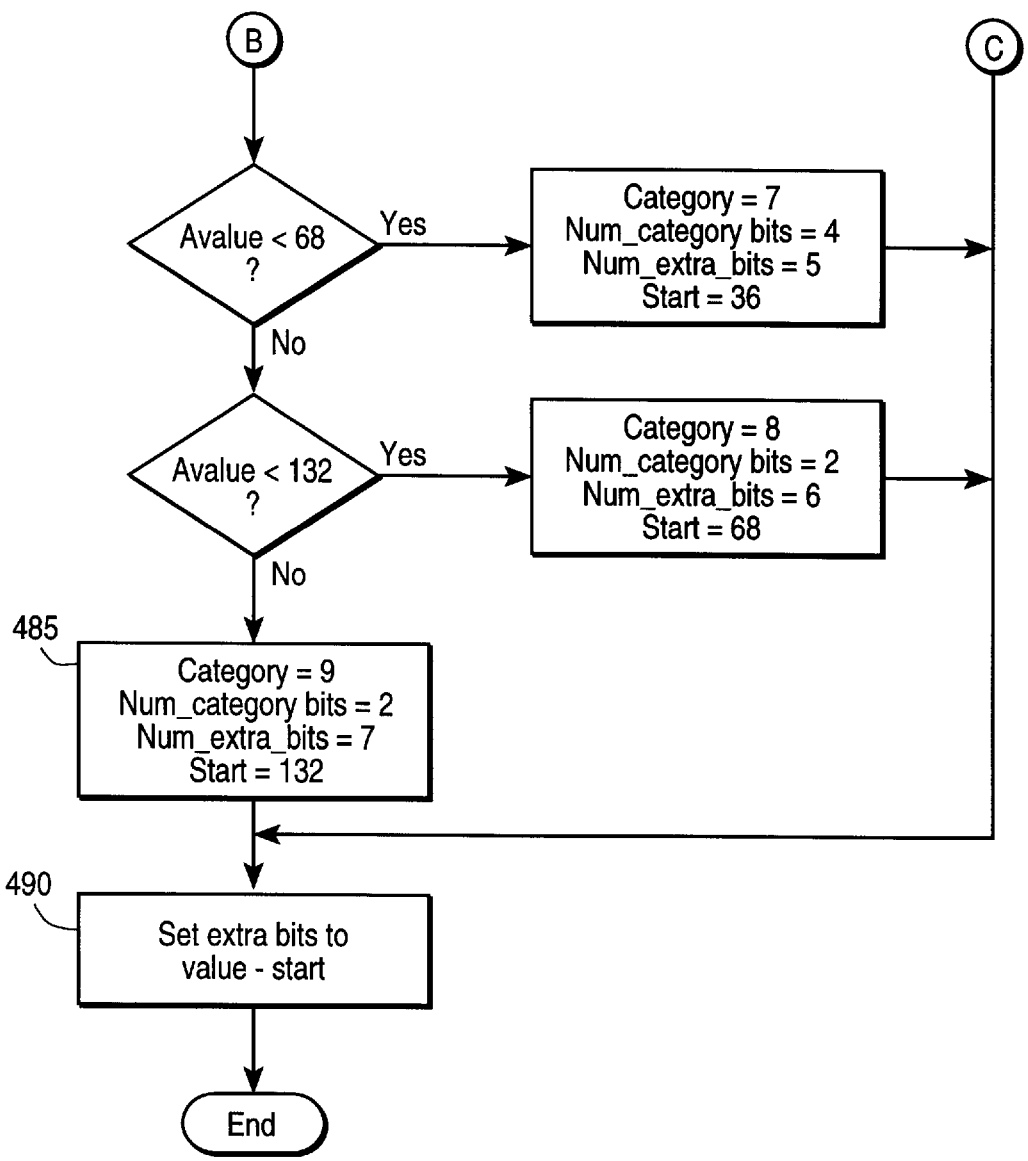
FIG_17B

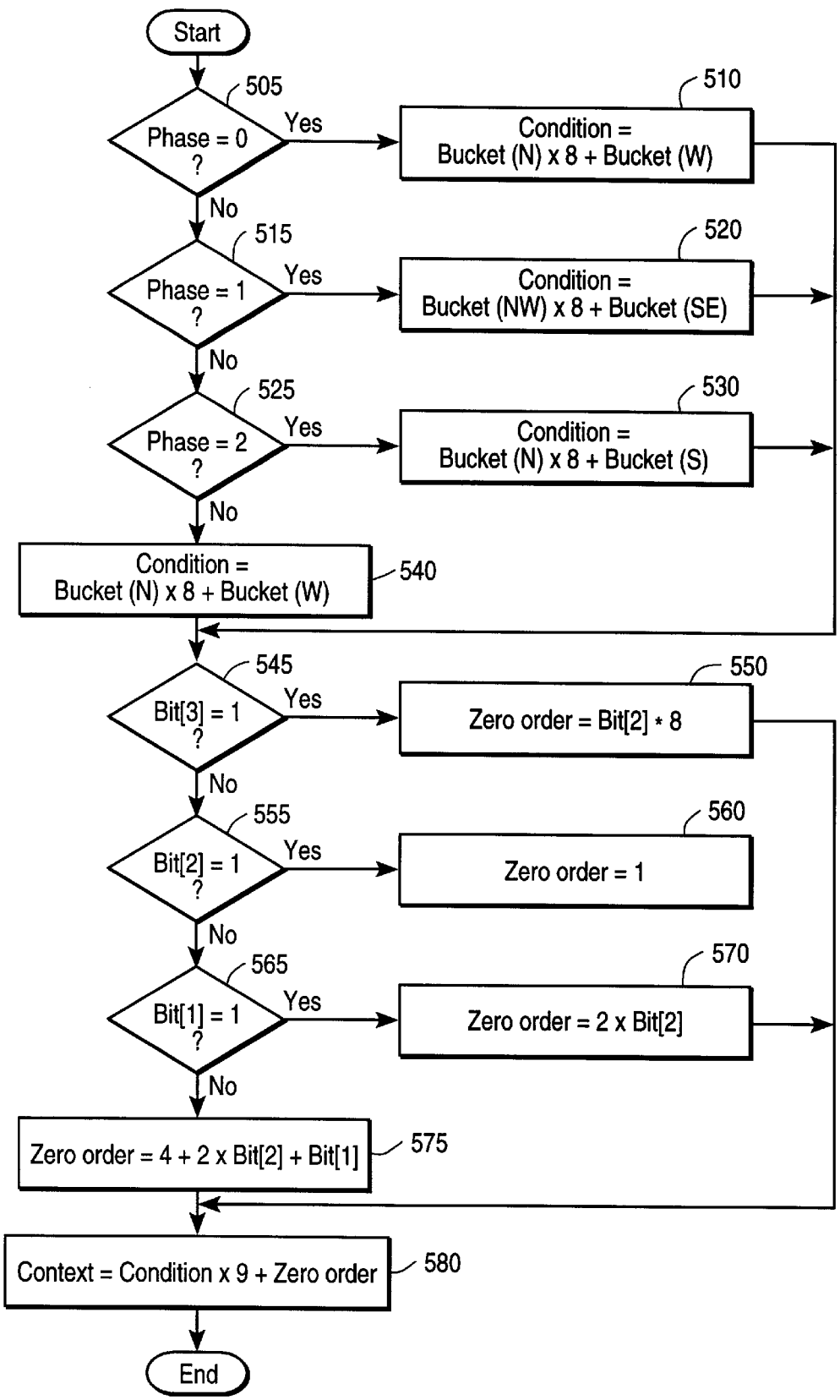
FIG_18

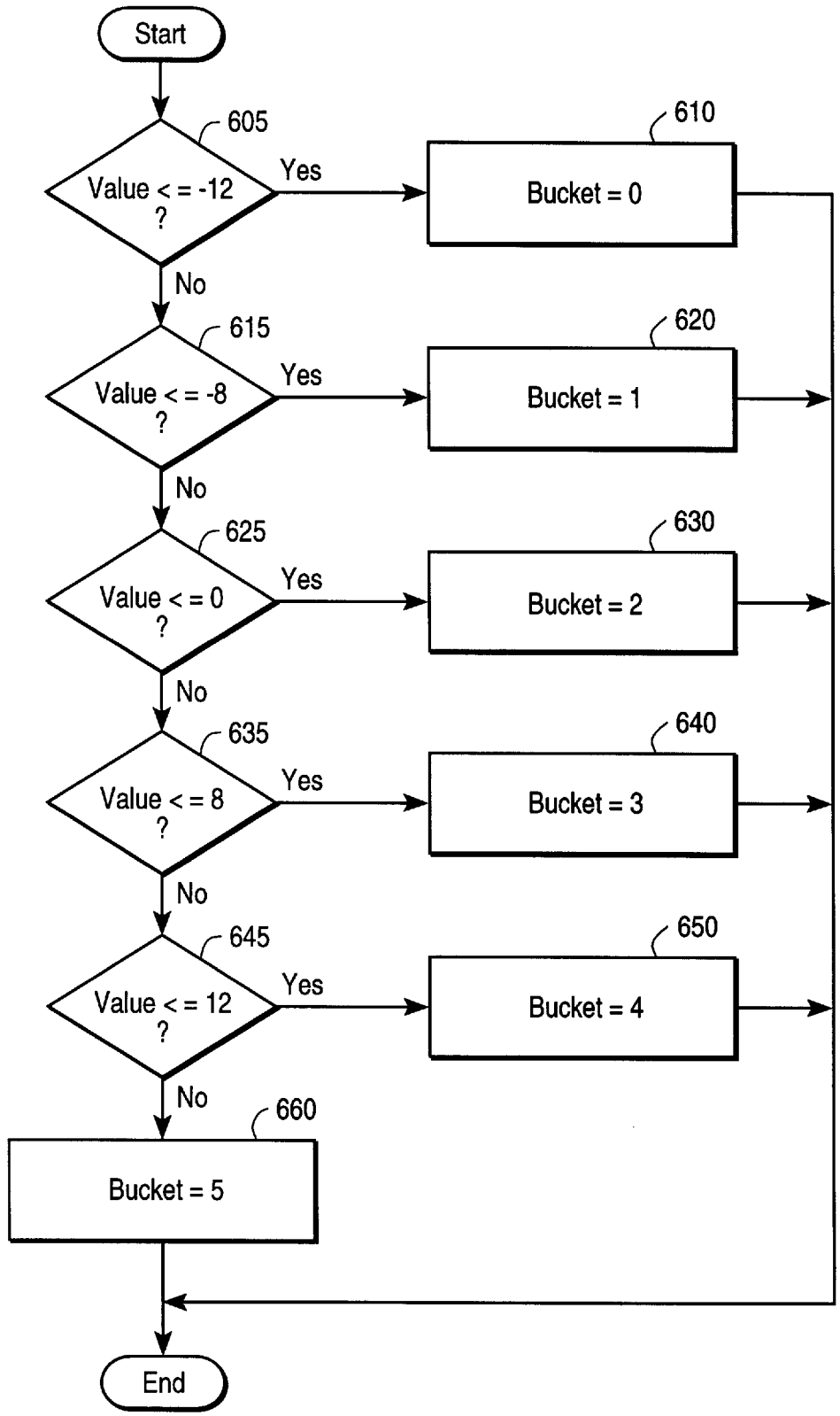
FIG_19

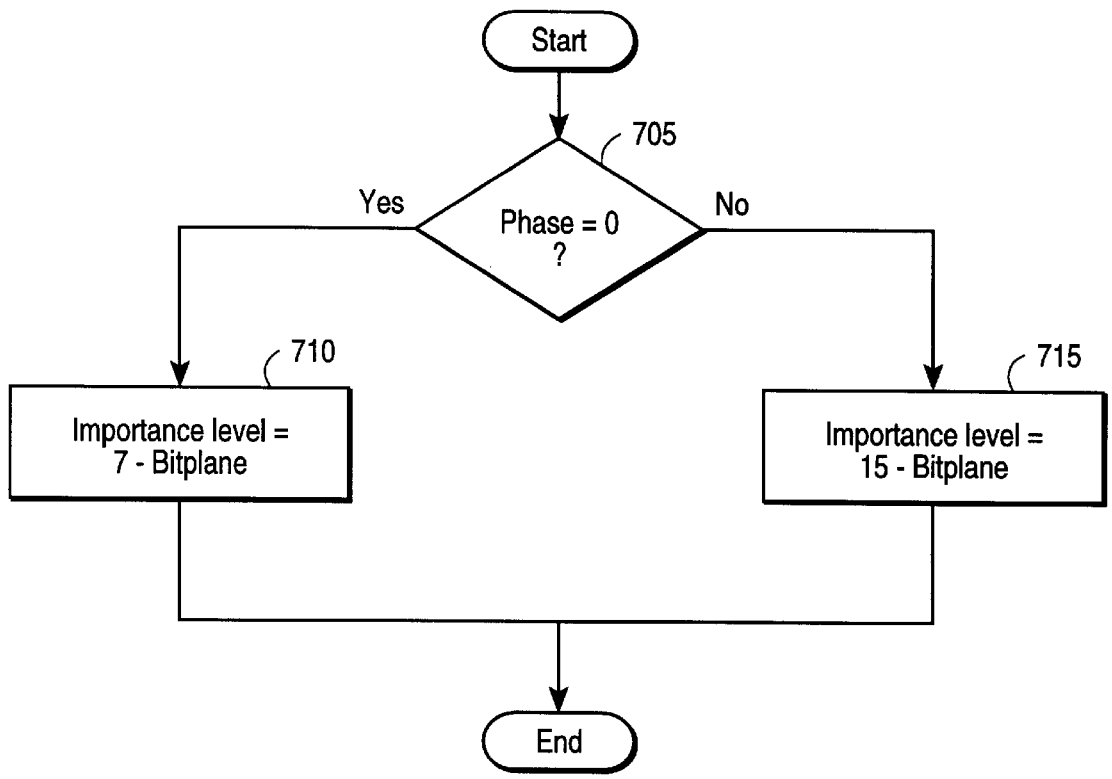
FIG_20A

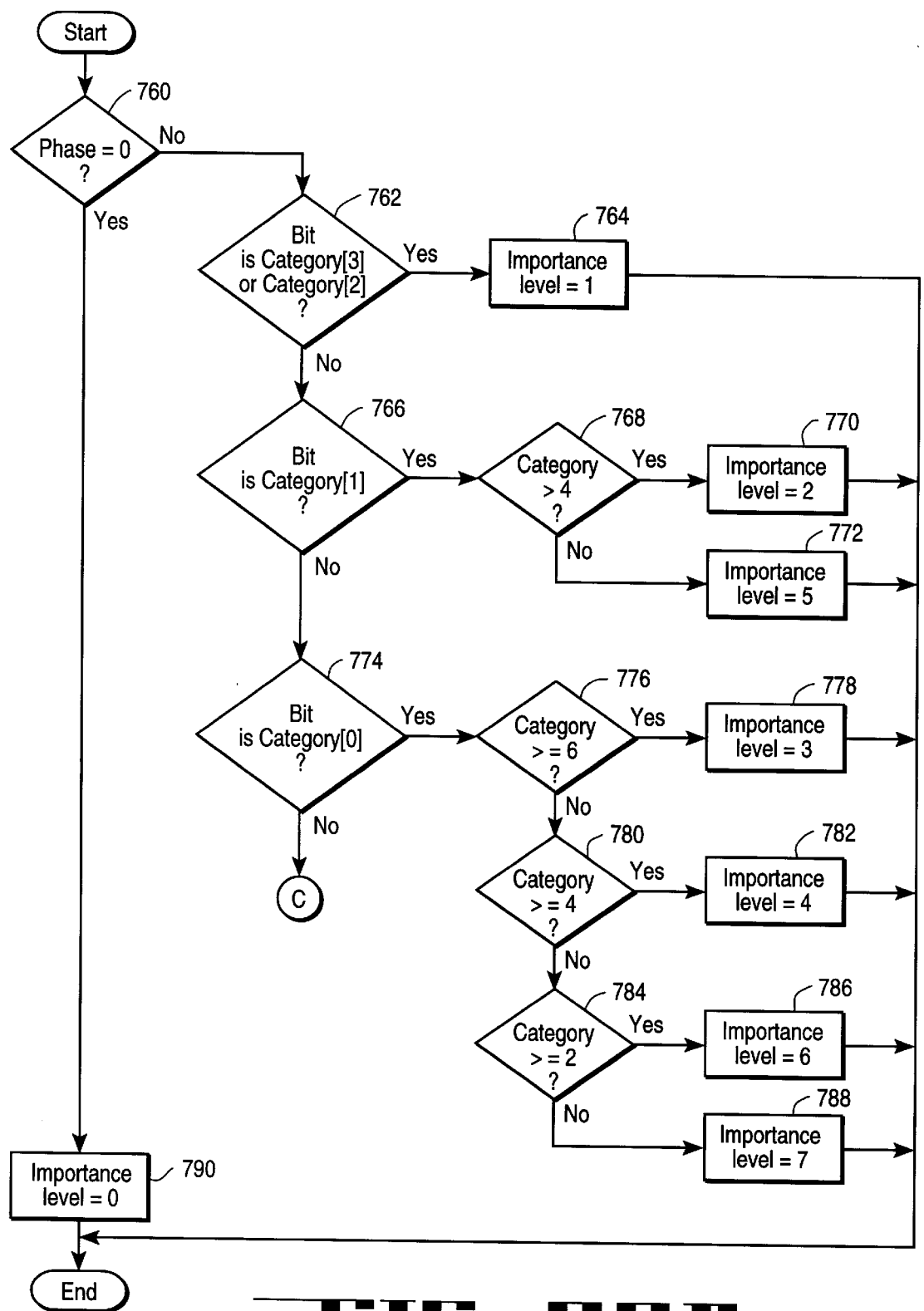
FIG_20B

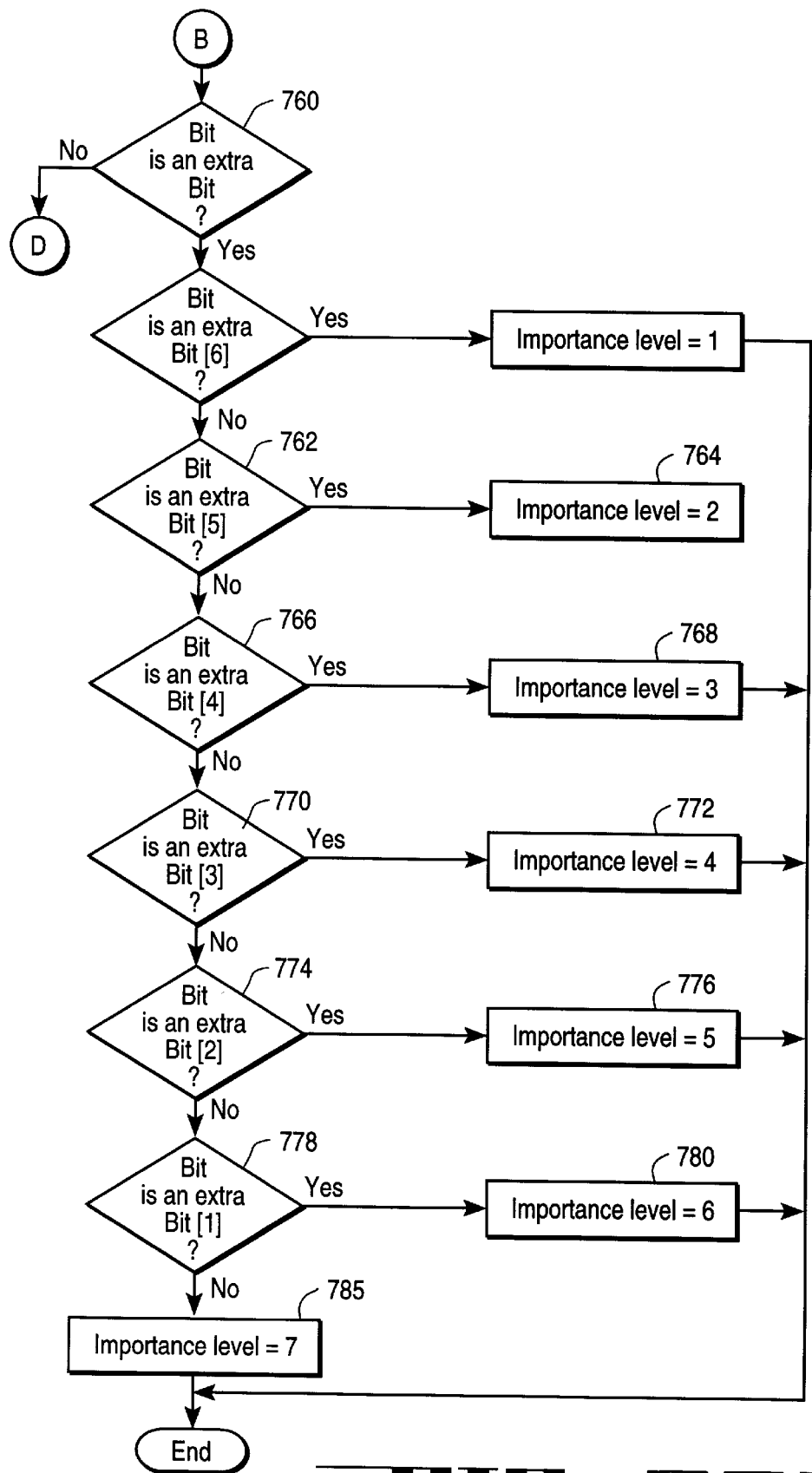
FIG_20C

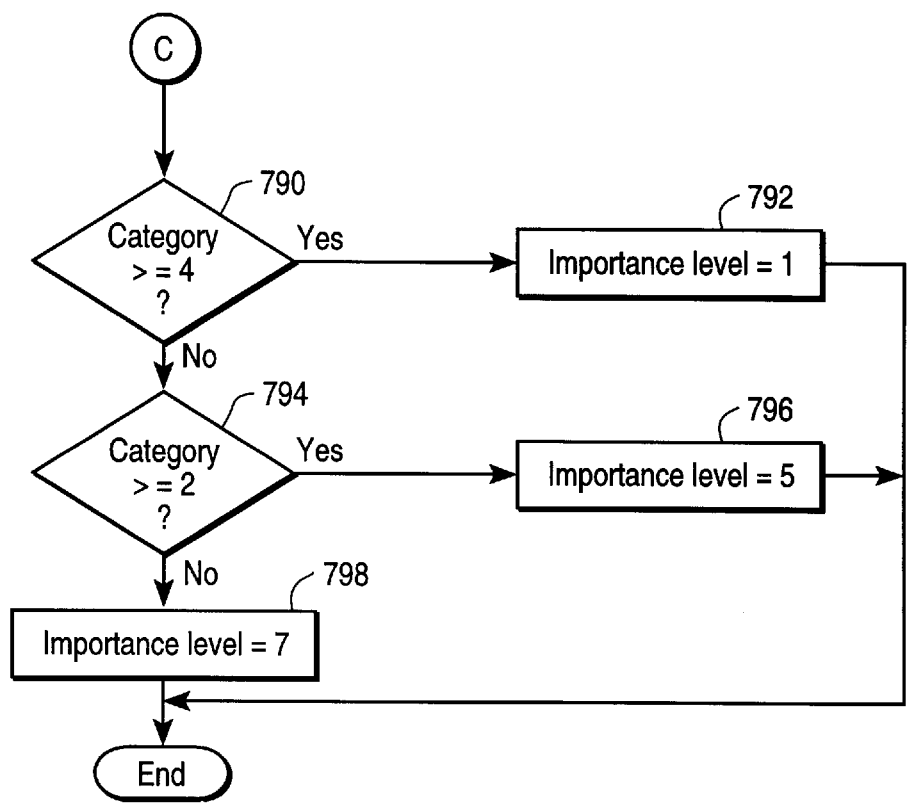
FIG_20D

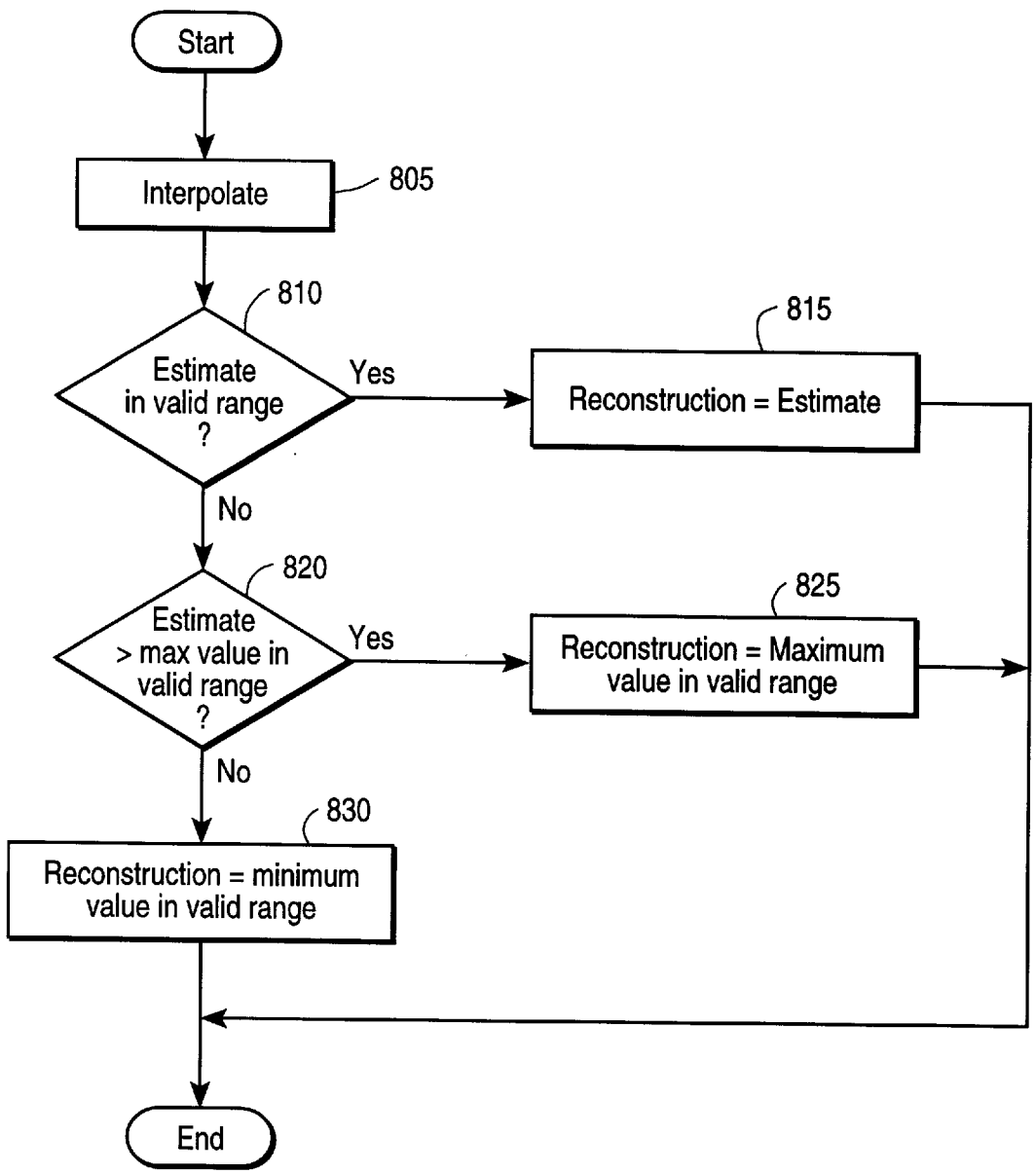
FIG_21A

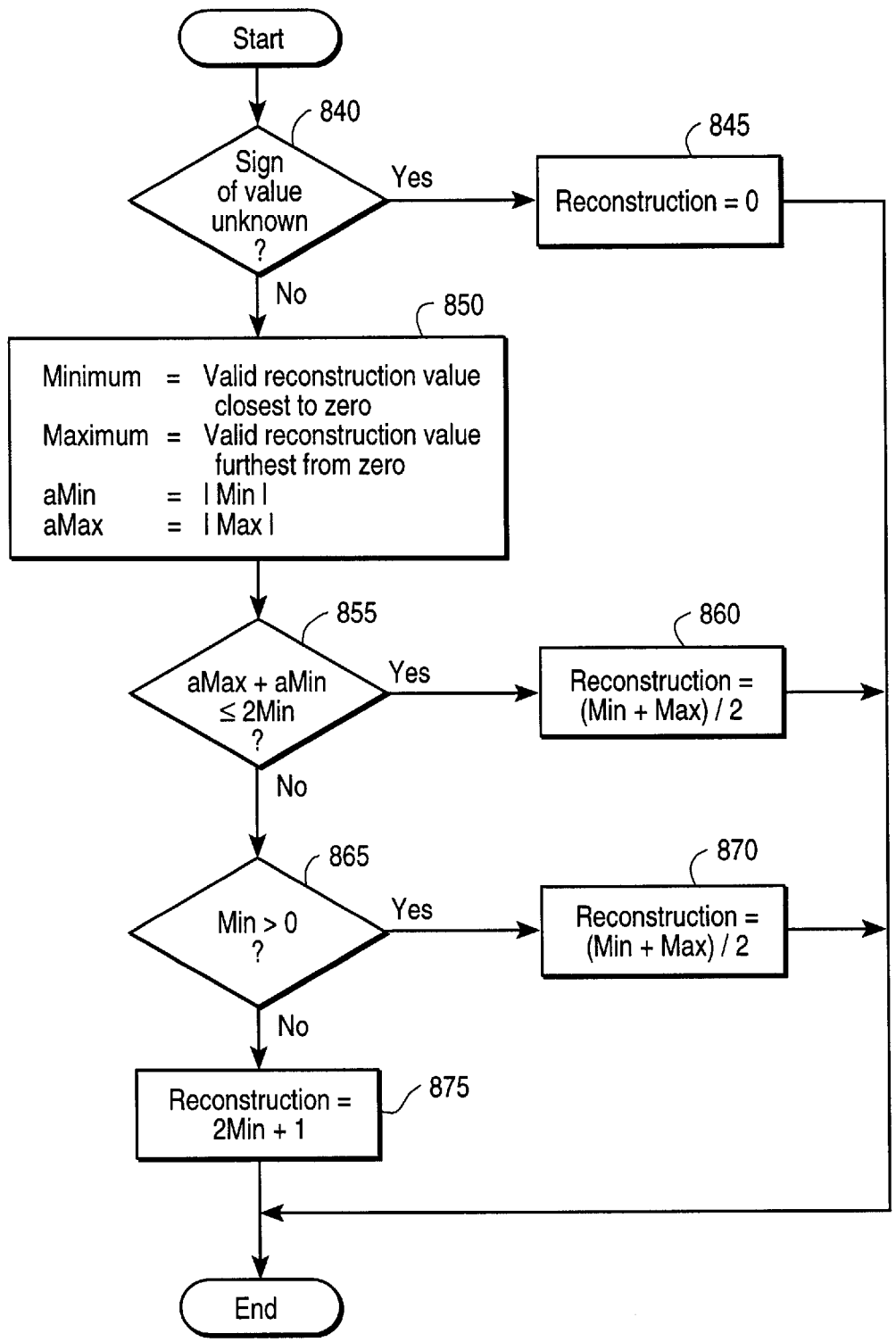
FIG_21B

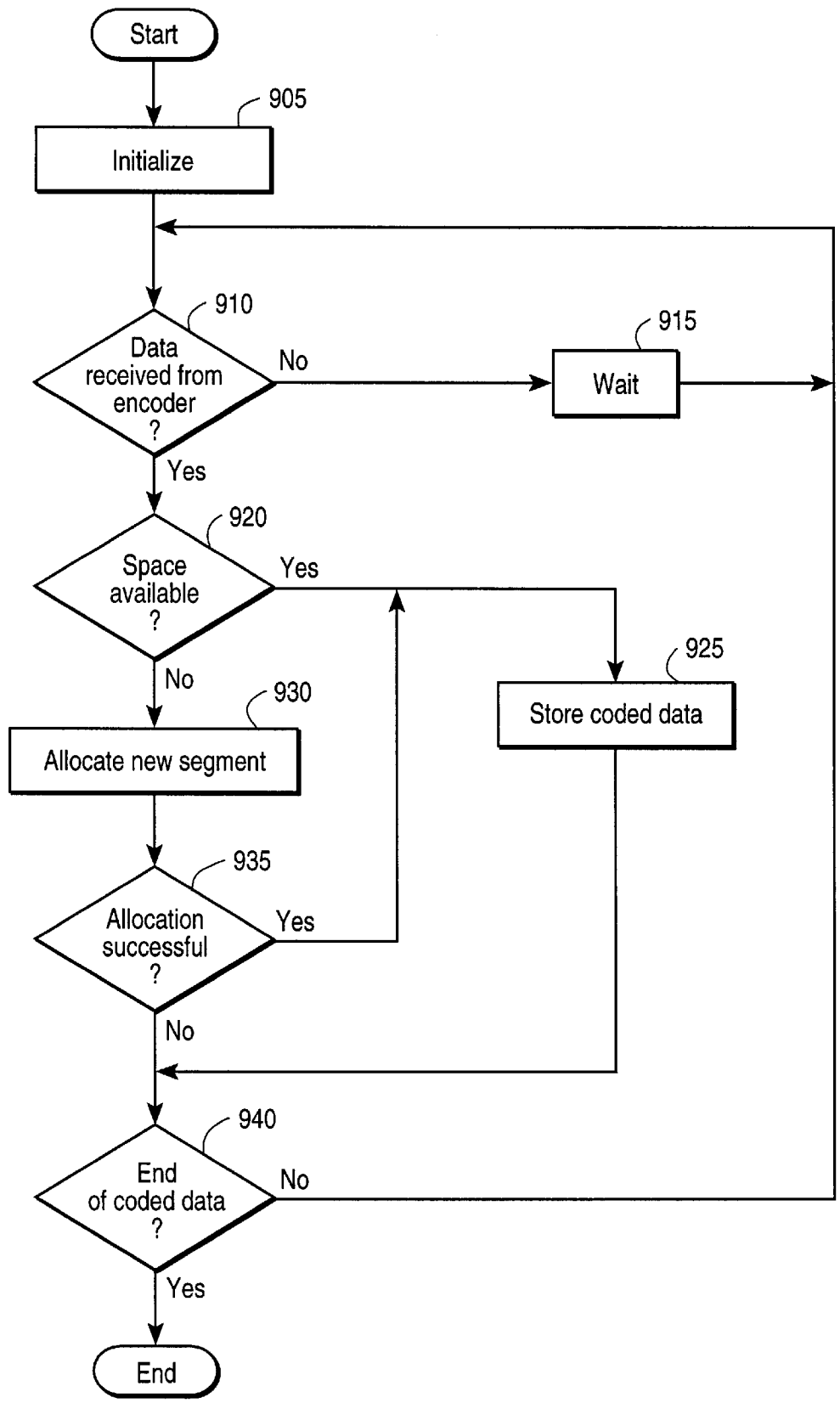
FIG_22

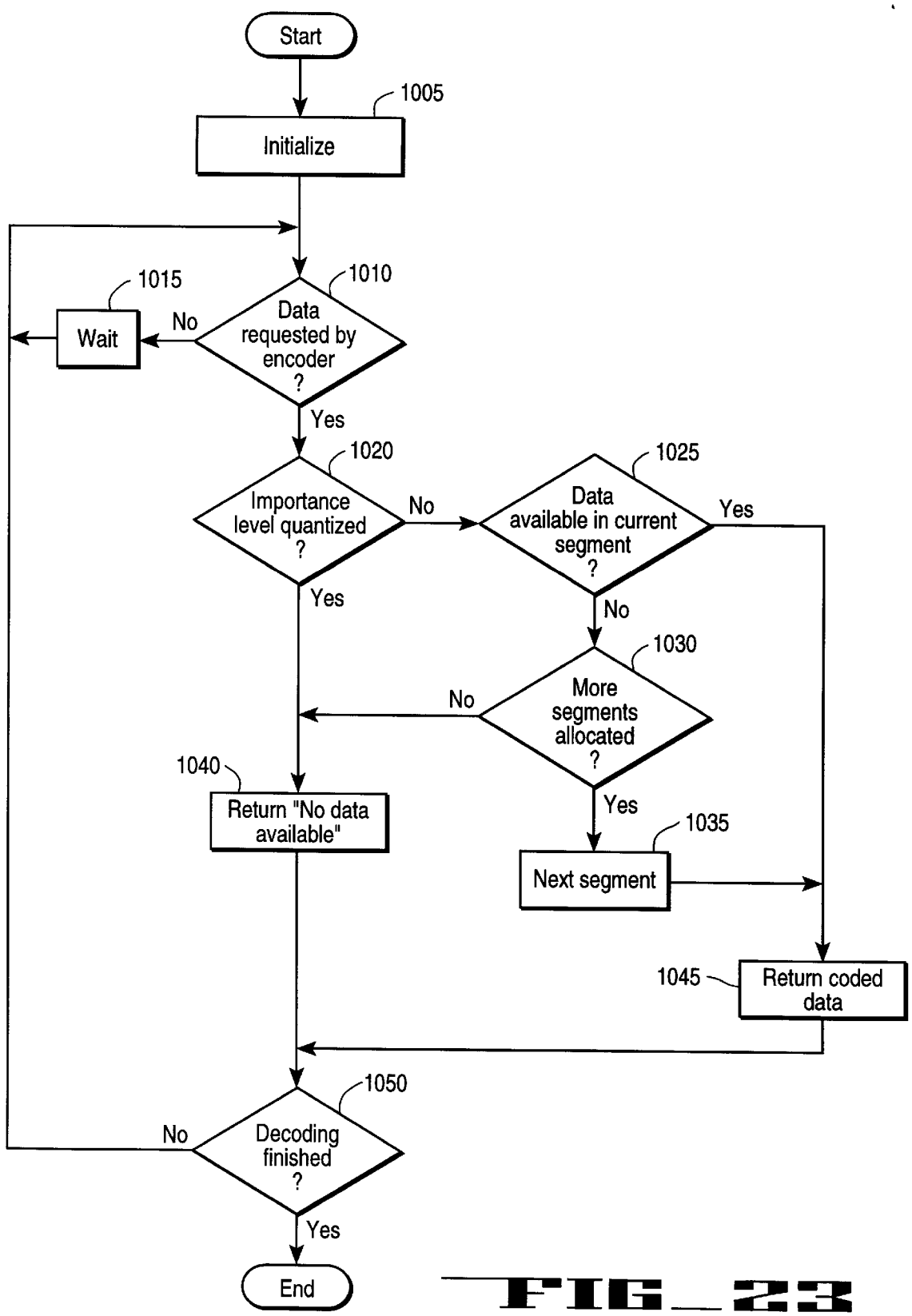
FIG_23

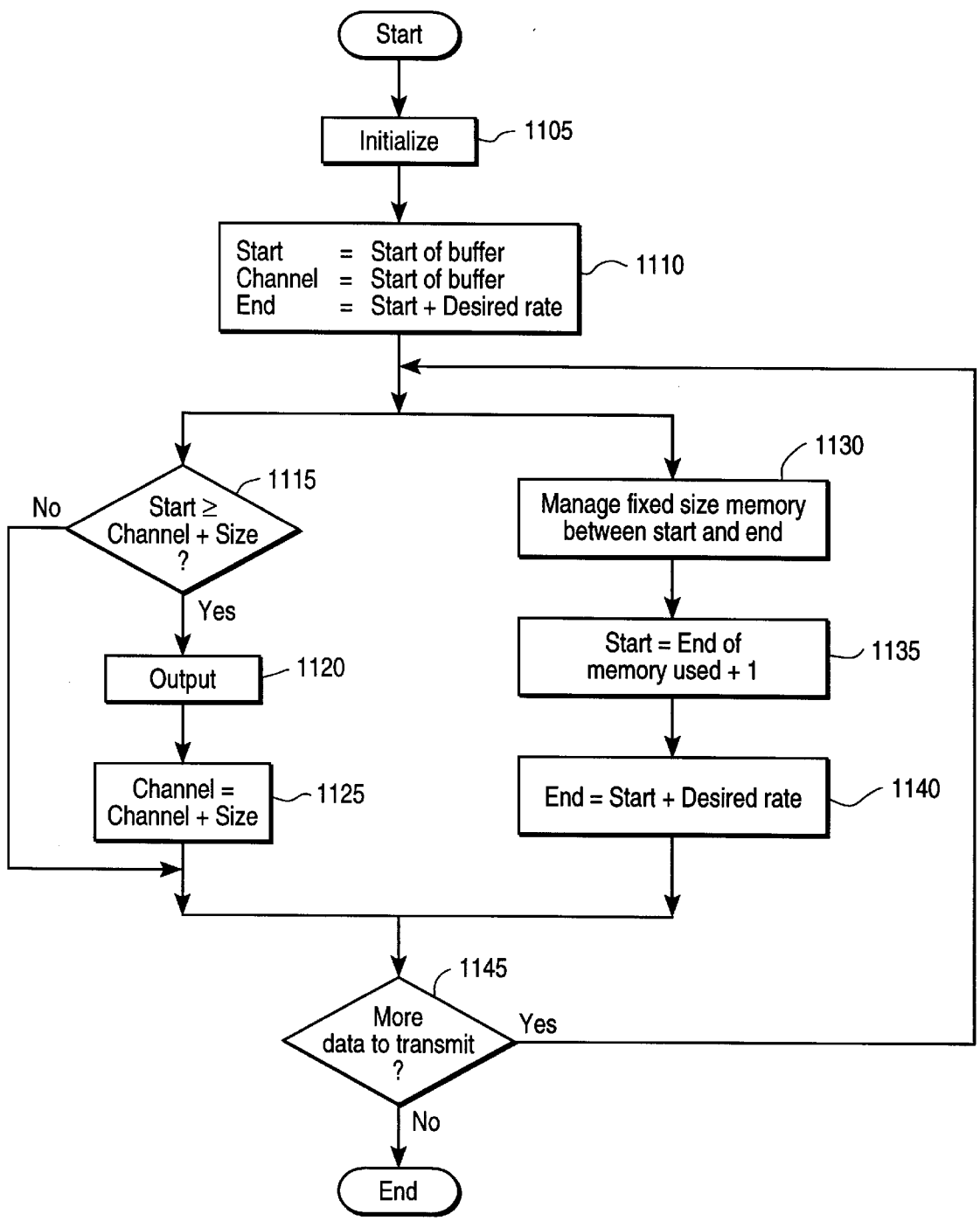
FIG_24

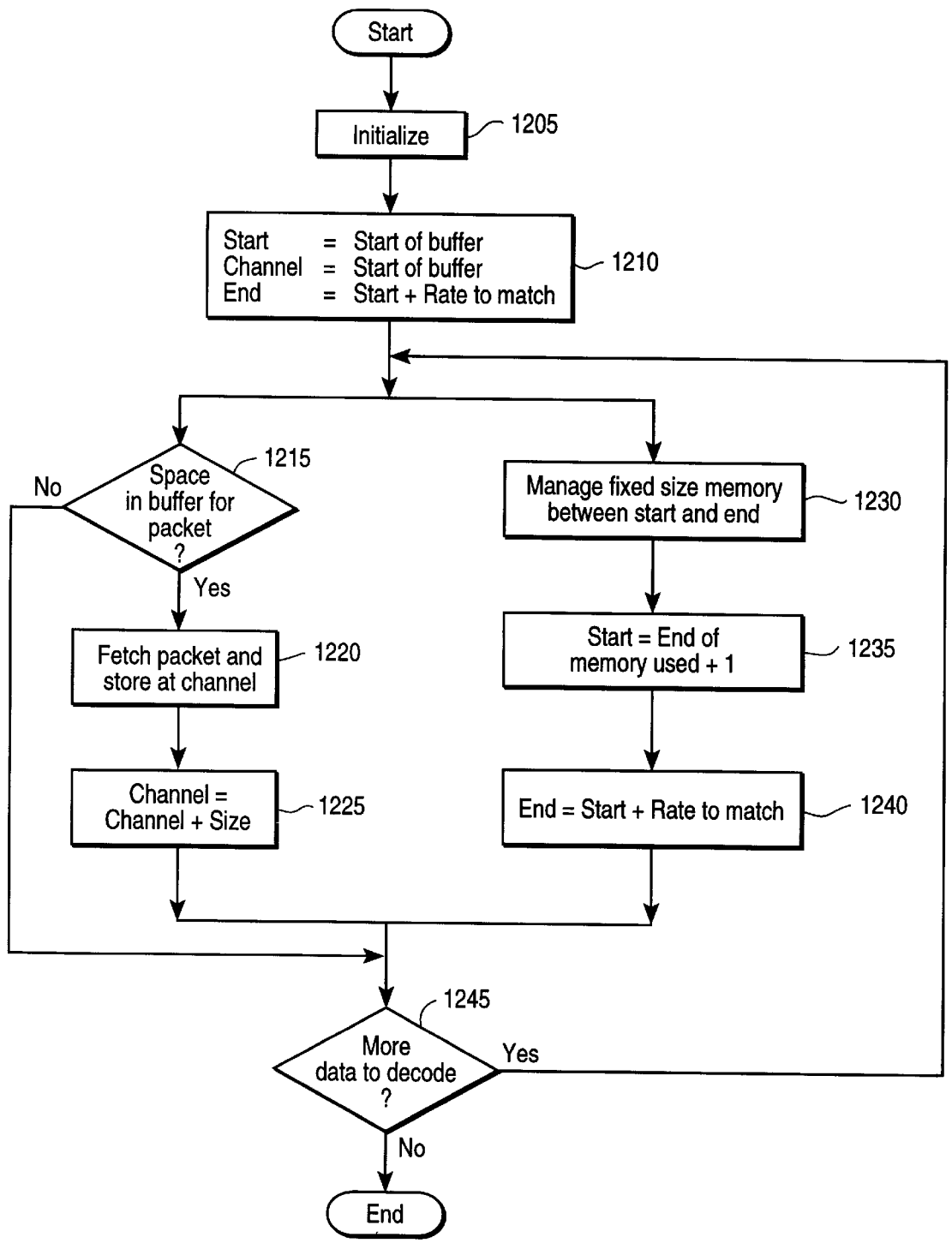
FIG_25

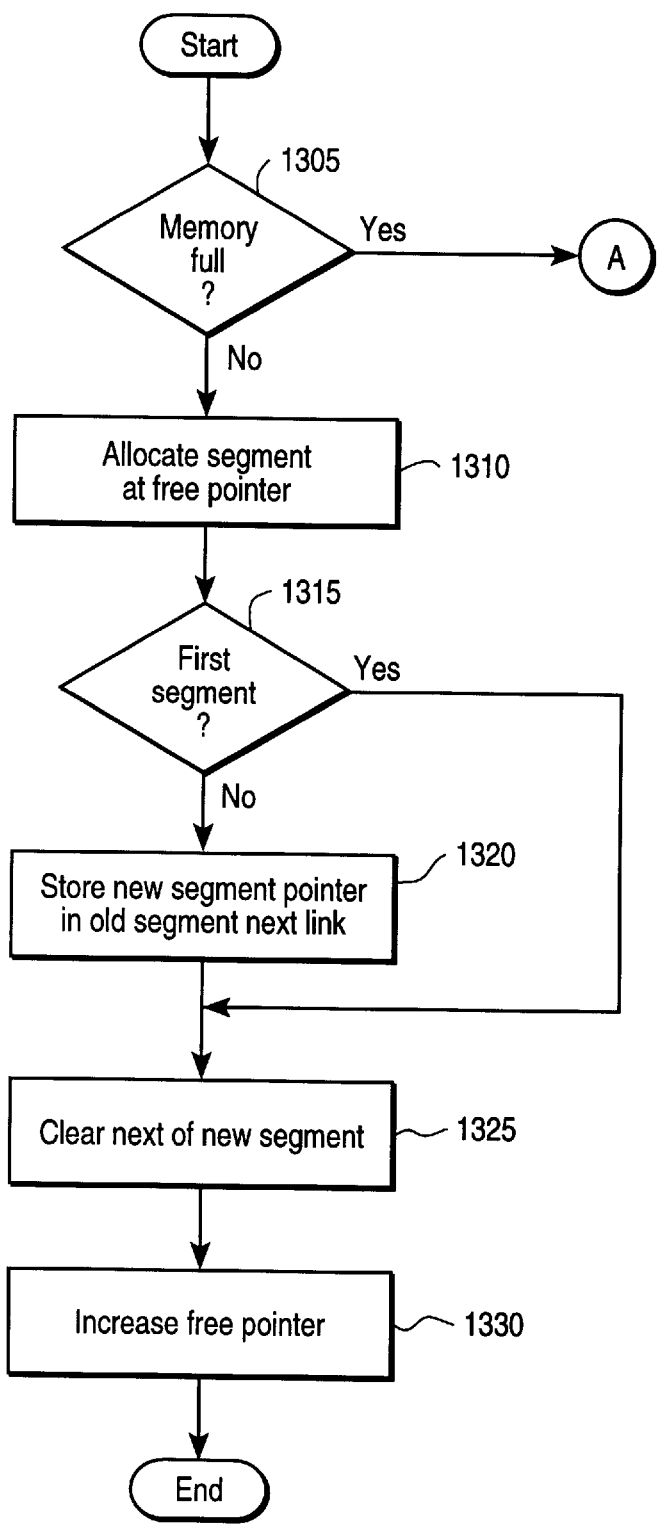
FIG_26A

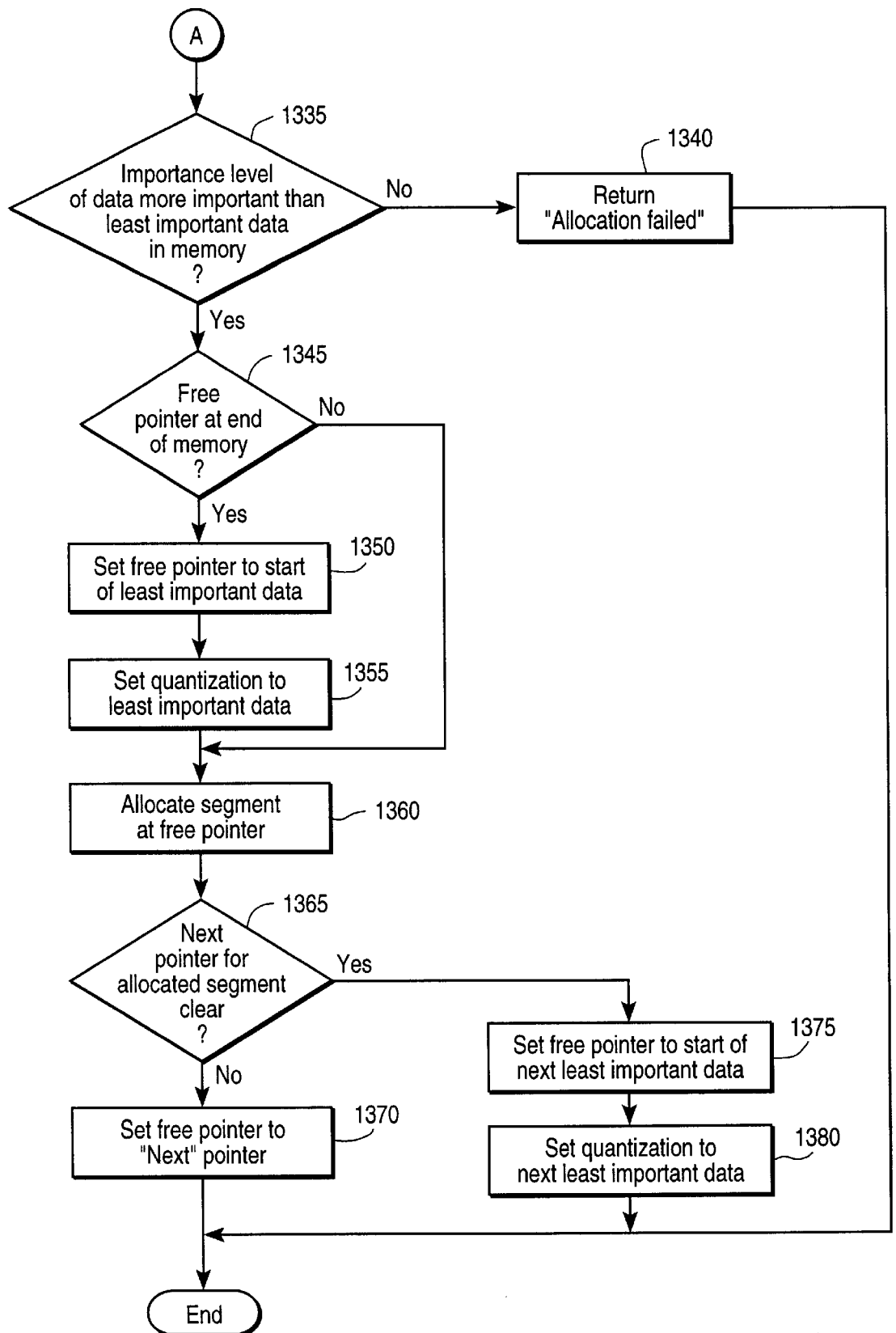
FIG_26B

METHOD AND APPARATUS FOR SPATIALLY EMBEDDED CODING

FIELD OF THE INVENTION

The present invention relates to the field of data compression and decompression systems; particularly, the present invention relates to compression and decompression systems that operate using coding in the spatial (e.g., pixel) domain.

BACKGROUND OF THE INVENTION

Data compression is an extremely useful tool for storing and transmitting large amounts of data. For example, the time required to transmit an image, such as a facsimile transmission of a document, is reduced drastically when compression is used to decrease the number of bits required to recreate the image. Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is the changes to the original data are done in such a way that they are not objectionable or detectable. In lossless compression, all the information is retained and that data is compressed in the manner which allows for perfect reconstruction. It is generally desirable to have a coding scheme that can switch between lossless and lossy without incurring large cost and complexity.

Bit plane coding and predictive coding are well-known image compression methods for lossless compression. Both bit plane coding and predictive coding operate in the spatial domain directly on pixels. This is unlike many prior art compression schemes that operate in the transform domain. Prior art bit plane and predictive methods either cannot support lossy compression in one-pass encoding or cannot support lossy compression at all.

Almost all transform domain image compression techniques are used primarily for lossy compression. This is because rounding errors in most transforms prevent their use for lossless compression. Note that the use for lossless compression implies that the compression ratio achieved for lossless compression is competitive with standard lossless techniques. Although a residue error image could be kept to make any lossy system lossless, the total "compression" achieved is usually poor. One example of a unified lossless/lossy compression system has recently been introduced as a compression with reversible embedded wavelets system introduced by Ricoh Corporation of Menlo Park, Calif. For more information, see Zandi, et al., "CREW: Compression With Reversible Embedded Wavelets", *IEEE Data Compression Conference*, Snowbird, Utah, pp. 212–21, March 1995 and Schwartz, et al., "Implementation of Compression with Reversible Embedded Wavelets", *SPIE 40th Annual Meeting*, vol. 2564, San Diego, Calif., July 1995.

The prior art also includes hierarchical coding which is typically broken up into progressive or multi-use encoding. For more information, see M. Rabbani and P. Jones, *Digital Image Compression Techniques*, (SPIE Optical Engineering Press, 1991) pgs. 190–202. In hierarchial coding, data is encoded in such a way that it is possible to access a given image at different quality levels or resolutions. For example, when searching through an image data base, hierarichal coding allows the user to access lower quality versions of an image in order to determine if the image is the one being sought. If it is, additional data can then be transmitted in stages to further refine the image. This scheme is termed progressive. For an example of lossless image compression that is progressive, see Howard et al., "Fast and Efficient Lossless Image Compression", Data Compression Conference (DCC) 1993, page 351. See also Wang et al., "Reduced-difference Pyramid: A Data Structure for Progressive Image Transmission", *Optical Engineering*, July 1989, Vol. 28 No. 7, pgs. 708–712; Burt et al., "The Laplacian Pyramid as a Compact Image Code", *IEEE Transactions on Communications*, Vol. Com-31, No. 4, April 1983, pgs. 532–540; and K. Knowlton, "Progressive Transmission of Grey-Scale and Binary Pictures by Simple, Efficient, and Lossless Encoding Schemes", *Proceedings of the IEEE*, vol. 68, No. 7, July 1980, pgs. 885–896.

In another example, an image database might support a number of different output devices, each having different resolutions. In this environment, a hierarchial coding scheme allows each device to access a version of the image with the appropriate resolution. This is referred to as multi-use.

Most progressive or multi-use systems require multiple passes through the data. This requires storing all uncompressed data during compression or decompression. For instance, see International Standard, ISO/IEC 11544, First Edition, "Information Technology-Coded Representation of Picture and Audio Information-Progressive Bi-level Image Compression", JBIG, 1993. In both progressive or multi-use hierarichal coding, there is no one-pass encoding that is supported for limited resources, such as a fixed rate application where a limited bandwidth channel is included in the system or in fixed size applications where a limited storage is in the system. However, limited bandwidth channels and limited size storage are often limitations that systems do have and the compression that is available in a one-pass environment would be limited to such. Therefore, it is desirable that a compression/decompression system can support fixed rate applications or fixed size applications. In such a system, it would be desirable to be able to move between lossy and lossless coding schemes based on the system limitations, such as a limited bandwidth channel or a limited size storage.

The present invention provides a spatially embedded compression/decompression system in a unified lossy/lossless coding scheme that operates in the spatial (e.g., pixel) domain. The present invention avoids the costly transformations associated with prior art transform domain in which compression techniques, which are costly with respect to computation and buffering. The spatially embedded compression/decompression system of the present invention provides one-pass encoding which supports fixed rate applications in which the lossy/lossless quantization is determined by a limited bandwidth channel, or fixed size applications, in which the lossless/lossy quantization is determined by a limited size storage. The present invention provides for embedded compression without the need to store the entire original data during compression.

SUMMARY OF THE INVENTION

The present invention provides a method and apparatus for compressing and/or decompressing data. In one embodiment, a system comprises a one-pass spatially embedded compressor and a limited bandwidth channel. The compressor comprises image data into compressed image data in one-pass. The compressor comprises an encoder and a coded data manager.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 1 is a block diagram of one embodiment of the spatially embedded compression/decompression of the present invention.

FIG. 2 is a block diagram of a more detailed implementation of one embodiment of the present invention.

FIG. 3 illustrates an image depicting both high-accuracy (low resolution) and low-accuracy (high resolution) pixels.

FIG. 4 illustrates an example of constrained interpolation.

FIGS. 5A and 5B illustrate one embodiment of a bitplane template and a block diagram of one implementation of the template, respectively.

FIG. 6 illustrates an example of an embedding scheme.

FIG. 7 illustrates an alternative embodiment of an embedding scheme.

FIGS. 8A and 8B illustrate bitplane templates.

FIG. 9 is a block diagram of one embodiment of a context model for prediction coding.

FIG. 10 illustrates one embodiment of two pixel predictors for an embedded system.

FIG. 11 illustrates a block diagram of one embodiment of a context model for predictive coding.

FIG. 12 illustrates a block diagram of a parallel coder chip for predictive coding that includes shifting logic.

FIG. 13 illustrates one embodiment of an embedding scheme for a system.

FIG. 14 illustrates one embodiment of the encoding process of the present invention.

FIG. 15 illustrates one embodiment of the decoding process of the present invention.

FIG. 16 illustrates one embodiment of the decorrelate and inverse decorrelate process for predictive coding of the present invention.

FIGS. 17A and 17B illustrate one embodiment of the process for binarization.

FIG. 18 is a flow diagram of one embodiment of the process for generating context according to the present invention.

FIG. 19 is a flow chart of one embodiment of the bucket procedure of the present invention.

FIG. 20A is a flow diagram of one embodiment of the process for determining the importance level for a bitplane.

FIGS. 20B–20D are flow charts of one embodiment of the process for determining the importance level for predictive coding.

FIG. 21A is a flow diagram for one embodiment of the reconstruction process for bitplane coding according to the present invention.

FIG. 21B is a flow diagram of one embodiment of the reconstruction process for predictive coding.

FIG. 22 is a flow diagram of the operation of the fixed sized manager in the encoding process.

FIG. 23 is a flow diagram of the operation of the fixed size manager during decoding.

FIG. 24 is a flow diagram of the fixed rate data manager during encoding.

FIG. 25 is a flow diagram of the operation of the fixed rate data manager during decoding.

FIG. 26A and 26B illustrate the process for allocating a new segment in memory.

DETAILED DESCRIPTION OF THE PRESENT INVENTION

A method and apparatus for compression and decompression is described. In the following detailed description of the present invention numerous specific details are set forth, such as types of coders, numbers of bits, signal names, etc., in order to provide a thorough understanding of the present invention. However, it will be apparent to one skilled in the art that the present invention may be practiced without these specific details. In other instances, some well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

OVERVIEW OF THE PRESENT INVENTION

The present invention provides for compressing and decompressing data using spatially embedded coding. In the present invention, the compressed data is ordered based on a metric, such as bit-significance. This is referred to in the art as embedded coding. The present invention uses bit-significance embedded coding in the spatial domain.

In one embodiment, the present invention provides spatially embedded coding by bit-significance ordering. In bit-significance ordering, image (or data) information is arranged into bit planes. The bit planes are ordered starting with the most significant bit (MSB) and going towards the least significant bit (LSB). The elements of each bit-plane are arranged into an order (e.g., raster scan order, etc.).

In an alternate embodiment, spatial embedded coding is performed using a hierarchical scheme based on the assumption that neighboring pixels of an image are strongly correlated and, therefore, the neighboring elements of a bit plane also carry redundant information.

FIG. 1 illustrates a block diagram of one embodiment of the spatially embedded compression/decompression system of the present invention. Referring to FIG. 1, system 100 comprises a one-pass spatially embedded compressor 101 that receives image data 110 and outputs compressed image data. The output of compressor 101 is coupled to a limited bandwidth channel or limited size storage 102 which transfers or stores the compressed data, respectively. The limited bandwidth channel/limited size storage 102 is also coupled to spatially embedded decompressor 103 which receives the compressed data, decompresses it, and outputs the decompressed data as an image 111.

The spatially embedded compression/decompression system of the present invention is a unified lossy/lossless coding scheme that operates in the spatial (e.g., pixel) domain. Depending on whether system 100 is lossless or lossy, image 111 may be identical to image 100. For embodiments with a limited memory, if the data can be compressed enough to fit in the fixed-size memory (e.g., frame store), then the compression is lossless. If the compressed data overflows the compressed data memory, the present invention degrades the image gracefully. In the present invention, there is no (perceivable) scan direction or regional orientation to the degradation, and extreme degradation, such as truncating a portion of the image, is avoided.

Furthermore, the present invention avoids costly transformations, both as to computational cost and buffering cost associated with the transformations.

The one-pass encoding of the present invention supports fixed-rate applications in which lossless/lossy quantization is determined by a limited bandwidth channel or fixed-size applications in which lossless/lossy quantization is determined by the limited size storage available in the system.

FIG. 2 is a block diagram of a more detailed implementation of the embodiment of the present invention illustrated in FIG. 1. Referring to FIG. 2, one-pass spatially embedded compressor 201 comprises one or more encoders 201A coupled to a coded data manager 201B. Similarly, the spatially embedded decompressor 203 comprises a coded data manager 203A coupled to one or more decoders 203B. As shown in FIG. 1, both one-pass spatially embedded compressor 201 and spatially embedded decompressor 203 are coupled to either limited bandwidth channel or limited size storage 202.

Each one of the one or more encoders 201A produces coded data labeled by importance. Coded data manager 201B identifies which data is important and decides, based on a limited bandwidth channel (available bandwidth) or limited size storage (available storage), which data to transmit or store, respectively, and which data to discard, if any.

Thus, coded data manager 201B operates in a decoupled, or independent, manner with respect to the one or more encoders.

Similarly, coded data manager 203A and the one or more decoders 203B operate in a decoupled manner. Coded data manager 203A obtains data from either limited bandwidth channel or limited size storage 202 and provides the data to the one or more decoders 203B based on the importance level embedded in the data. To that end, coded data manager 203A may provide all of the data or only a portion of the data to the one or more decoders 203B.

Spatially Embedded Compression

In one embodiment, both the spatially embedded compressor and the spatially embedded decompressor operate using a spatially embedded context model (SECM). The SECM uses a resolution reduction technique to separate the data into a low resolution "high-accuracy" image and a full resolution "low-accuracy" image. Once separated, the present invention codes the low resolution "high-accuracy" pixel losslessly, while coding the high resolution "low accuracy" pixels as accurately as possible based on the channel bandwidth available or the storage size to be used.

The resolution may be reduced by subsampling, thereby selecting the most important data. In one embodiment, the present invention generates the high-accuracy image by subsampling (decimate) by two in each dimension which creates an image one-fourth the size. Subsampling is well-known in the art. Thus, the data is decomposed into an "important" part which contains most of the raw information and a "less important" part which contains only the details.

FIG. 3 illustrates an image depicting both high-accuracy pixels (solid black dots) and low-accuracy pixels (solid white dots). The quarter size image comprising the black dots is coded losslessly (or very close to losslessly). Because of the lossless coding, this information is referred to herein as "high accuracy" (image or pixels). The other image data comprises the remaining three-quarters of the pixels (shown as the white dots), which are coded as accurately as possible given the size of the compressed data memory or the bandwith of the channel. Subsampling has the desirable property of critical sampling. This property is that the total number of pixels (samples) for both the high and low-accuracy images is the same as the number of pixels (samples) in the original image. Subsampling by amounts other than two in each dimension are possible.

Note that the scheme discussed above is considered embedded because the bit stream can be interrupted at any point within the low-accuracy data and bits are located in the stream with smooth details (e.g., more important bits) earlier in the stream than the most important bits, the finer details with are located later in the stream. As described in further detail below, if the bit stream is interrupted at some point, then missing pixels can be estimated by using interpolation techniques.

After defining the high-accuracy image and the low-accuracy image, both images undergo compression and the compressed data for the high-accuracy image is separated from the low-accuracy image. Note that in one embodiment, separation may occur prior to compression. The compressed data for the low-accuracy image is embedded. Embedding may also be performed on the high-accuracy image. It should be noted that this separation and embedding is not important if all the coded data can be stored in memory or all the coded data may be transferred (i.e., when lossless coding occurs).

A high-accuracy image that is one-quarter the size of the original image is good for target compression ratios of up to 4:1, since in the worst case for an incompressible image, it can always be stored exactly. For target compression ratios less than 4:1, there will always be memory available for coarsely representing the low-accuracy image, even in the worst case. If the high-accuracy image is compressed in an embedded function, compression target compression ratios of slightly more than 4:1 can be accommodated. For higher compression ratios, performing more resolution reduction might be desirable. Resolution reduction may be applied recusively to the high-accuracy image.

After or during compression, the coded data manager determines which data is transmitted or stored based on the limitations of the channel or memory. When a channel is included in the system, the coded data manager must determine which data is to be discarded, if any, prior to data transmission. When a limited memory is involved, memory overflow must be handled. When the memory overflows, some of the coded data for the low-accuracy pixels is overwritten. Since neighboring high-accuracy pixels are known (either exactly or with low error), interpolation, or other prediction techniques, may be used to reconstruct the low-accuracy pixels. Any coded data for the low-accuracy pixels that is not overwritten is used to constrain the interpolation to a range of possible values.

FIG. 4 illustrates an example of constrained interpolation. In this example, errors will be constrained to ±4. Referring to FIG. 4, original pixels 401 are shown with a subset of high accuracy pixels 402. Based on two surrounding high accuracy pixels, a prediction is made on an intervening pixel. In the first case with high accuracy pixels 403 and 404, the prediction is only off by 3. Therefore, the prediction does not have to be constrained by coded data, and the decoded value that results is the predicted value. However, in the second case with high accuracy pixels 404 and 405, the prediction by interpolation is 151, which is −12 off the actual value of 139. In this case, the prediction is constrained with coded data. The constrained value chosen, −8 in this case, is one selected from a group of 0, ±8, ±16, etc. It should be noted that the group of 0, −8, ±16, etc., is sufficient to contain prediction errors to ±4 as specified in this example.

The encoder determines what constrained data is necessary. The constraint data may be sent and interleaved with other coded data. In an alternate embodiment, the constrained values may be sent in a block of data which precedes or follows the coded data, or is sent in parallel. The encoder may label the data by importance level to identify constrained data. Note that in such a case, the data manager is able to use the importance level information to determine which of data in a data stream is constrained data.

Thus, when the buffer overflows, low-accuracy pixels are estimated in smooth regions without the need for coded data. They are represented coarsely at edges with a small amount of coded data. This provides errors that are hard to perceive both on natural images and on scanned text. For near-lossless compression, this is particularly advantageous.

In the present invention, the spatially embedded compressor performs compression on either bitplanes with a hierarchical, "JBIG-like" (different templates for different phases), context model or on difference values using predictive coding. In one embodiment, the low- and high-accuracy images do not have to be coded using the same technique. In this case, either bitplane or predictive coding may be used. The choice of which technique to use depends, in part, on a trade-off between compression performance and cost of implementation.

Bitplane Template Context Models

From a hardware perspective, context models can be very simple. FIG. 5A illustrates a bitplane template that provides seven bits of context ($2^7$=128 context bins) for binary data. FIG. 5B is a block diagram of one implementation of the template in FIG. 5A. Referring to FIG. 5B, pixels 501 are input to an optional Gray coding block 502. Gray coding is well-known in the art. One useful Gray coding operation is:

$$y = x \text{ XOR } (x>>1)$$

where x is the input, y is the output and "x>>1" represents shift right by 1 (divide by 2).

The output of optional Gray coding block 502 is coupled to local buffer 503, which stores the necessary bits for the context. In one embodiment, local buffer 503 stores the past two decoded bits. These bits may be stored in a shift register. Decoded bits are saved to a line buffer 504 and recalled so that local buffer 503 can also provide five bits from the previous line centered above the current pixel to be coded. These five bits may also be stored in a shift register. The outputs of local buffer 503 are a bit to be coded 505 and its context bin 506.

After Gray coding, each bitplane of the data is coded as a separate binary image. Coding "separately" means there are no dependencies so that all (or some) bitplanes may be coded in parallel. In one embodiment, the context model cycles through each bitplane for a given pixel before moving the template for the next pixel. When bitplanes are coded in parallel, different context bins are used for each bitplane. In this way, the probability estimation for each bitplane may remain separate.

Spatial Embedded Context Model Using Bitplanes

The embedded system of the present invention separates data of different importance levels. The importance levels may be separated, for example, based on bit position or bitplanes. That is, an importance level is associated with the data based on the bit position of the data or in which bitplane the data resides. Since each different importance level adds some complexity, multiple bitplanes may be part of the same importance level. Note that the separation may be performed in software or hardware.

FIG. 6 shows an example embedding scheme intended for a 2:1 compression in which importance levels are assigned to bits in both the high-accuracy (¼) pixels and the low-accuracy (¾) pixels. Referring to FIG. 6, four levels of importance are used. Data corresponding to each distinct importance level may be used to form an independent stream that is coded by a distinct coder. In other words, coding with distinct coders can form independent streams. Note that the distinct coder could be a "virtual" decoder in that one coder handles multiple streams for multiple importance levels, as long as separate state information is maintained for each stream.

In one embodiment, zero is the most important level. The numerically largest level will be discarded first when memory overflows. The amount of data represented by importance level zero may be chosen to allow the most important data to be preserved even if the coding causes a small amount of expansion. Thus, the system provides graceful degradation for any possible input.

For compression targets higher than 2:1, eight importance levels might be used. FIG. 7 illustrates one embodiment of an embedding scheme that might be used for a target compression of 3:1 or 4:1.

The resolution reduction of the embedded context model is also considered when using a bitplane template. An example set of templates is shown in FIGS. 8A and 8B. FIG.

8A illustrates bitplane templates using 20 possible pixels. These templates show available pixels for creating smaller templets, 20 is too many for most applications. FIG. 8B illustrates bitplane templates using half (10) of those 20 possible pixels as the context. In each of FIGS. 8A and 8B, a separate template is used for each of the four phases (0, 1, 2, 3) as in a "JBIG-like" system. Note that in such an embodiment, the line buffer requires multiple lines. In one embodiment, a two line buffer, with some additional memory may be used. Three and four line buffers may also be used. In some embodiments, the cost of line buffering is not important; for systems with tiling, the buffer must be able to store an entire tile. Other templates may be used. Note that to enable parallelism, different bitplanes may need to be processed in parallel, just like in a non-embedded system.

Spatial Embedded Context Model Using Predictive Differential Coding

In an alternate embodiment, predictive coding may be used to predict pixels from neighbors and to code the prediction errors. An example of predictive coding is referred to as differential pulse coded modulation (DPCM).

There are three main differences between typical predictive coding and typical bitplane coding. First, bitplane methods require more context bins for the same compression, and assuming each context bin requires a predetermined number of bits of memory, then the memory for larger bitplane context models has a high hardware cost. Second, in a bitplane context model, every bit is entropy coded. Therefore, N-bit data requires N coding operations. For predictive coding data, some of the data can be assumed to be 50% random data and simply copied to/from the compressed data without needed entropy coding, thereby reducing the entropy coding operations and allowing hardware to operate at faster speeds. Third, combining embedding with a predictive coding context model is more difficult if more than a few importance levels are desired. Errors cannot be allowed to propagate in a predictive coding system. In one embodiment, only the most important data is used for predictions. This avoids error propagation. If the most important data is not sufficient for making good predictions, either compression will suffer or a significantly more complicated multi-step prediction must be used.

FIG. 9 is a block diagram of one embodiment of a context model for coding prediction errors. Referring to FIG. 9, pixels 901 are received by local buffer 902. Local buffer 902 is coupled to line buffer 903, which provides local buffer 902 with past pixels. The output of local buffer 902 is received by predict and determine error (e.g., interpolation block) block 904, which generates a prediction for an incoming bit and determines the error associated with the prediction with respect to the actual value of the bit. In one embodiment, the prediction is an average of two neighboring high-accuracy pixels. Other prediction methods may be used. The output of the predict and determine error block 904 includes a bit to be coded 905 and its context bin 906.

FIG. 10 illustrates one embodiment of two pixel predictors for the embedded system. Referring to FIG. 10, there are four different two pixel predictors, one for each of the four phases (0, 1, 2, and 3). Note that two lines of buffering are sufficient for the context model, and that this workspace may be shared with tiling or banding workspace. In one embodiment, two additional pixels, 1001 and 1002, may be used in the pixel predictor for phase 1.

In one embodiment, the high-accuracy image is not embedded, and all bits are losslessly coded. Since predictions are made from high-accuracy pixels, error propagation problems are eliminated. However, representing the high-accuracy pixels exactly for all images may result in poor rate/distortion performance.

In an alternate embodiment, the predictive coding scheme may embed the high-accuracy image. Coded data to specify the high resolution pixels to ±1 is always available. (Note that this is because all of the magnitude and sign bits, with the exception of sign/magnitude bit 0, are coded as importance level 0. See FIG. 13). Even when sufficient coded data is available to know the exact value of a high-accuracy pixel, the result to ±1 is still determined. All predictions are made using the ±1 values of the high resolution pixels.

This scheme is based on two assumptions. First, the information to specify the least significant bit of high resolution pixels is both difficult to compress and of little visual importance. Better rate distortion would be achieved by allocating the same amount of coded data to more visually relevant low-accuracy pixel information. Second, using ±1 accuracy pixels in the predictor does not significantly reduce the predictor's effectiveness. This assumption is based on the idea that averaging two numbers gains one bit of precision; for example, adding two 7-bit numbers produce a result with 8-bit prediction.

For a predictive coding scheme, prediction errors are coded. For 8-bit pixels, 9-bit prediction errors are used. (Note that while using 8-bit prediction errors can be accomplished with the proper module 256 arithmetic for lossless coding, 9-bit prediction errors are required for lossy coding).

The method for coding prediction errors takes advantage of two properties: the errors have zero mean and are distributed such that small values are more common than large values.

FIG. 11 is a block diagram of one embodiment of a context model for predictive coding. Referring to FIG. 11, pixels 1101 are inputted into predictor 1102 which generates a prediction error 1103. The prediction error 1103 is converted to a sign magnitude format by sign/magnitude block 1104. The magnitude is at times referred to in the art as the category. Table 1 illustrates one embodiment of binary magnitudes for 9 bit prediction errors. In the present invention, the bits of the pixels in addition to the sign bit and the magnitude that are required to specify the exact value of the error are referred to herein as the mantissa bits (due to the similarity to mantissas in floating point numbers). (The bits are sometimes called "make-up bits" or "tail" bits in the art). The output of sign/magnitude block 1104 is coupled to the input of binarize block 1105, which performs binarization (i.e., turns its input into binary).

Given a set of values, there are numerous ways to convert them to binary. In the present invention, the binarization method is selected based on the fact that the bits are going to be compressed. In one embodiment, a tree is used to perform binarization. In one embodiment, binarization is performed according to the following method which processes the magnitudes as bitplanes:

TABLE 1

```
M = 8
WHILE (M > magnitude of error)     {
        code (error is insignificant at magnitude M)
        M = M - 1
}
IF (M == 0)
        code (error is insignificant at magnitude 0)
ELSE IF (M > 0)
        code (error is insignificant at magnitude M)
        code (M bits to specify sign and mantissa of error)
```

TABLE 1-continued

| magnitude of error | prediction error |
|---|---|
| 0 | 0 |
| 1 | ±1 |
| 2 | ±2 . . . 3 |
| 3 | ±4 . . . 7 |
| 4 | ±8 . . . 15 |
| 5 | ±16 . . . 31 |
| 6 | ±32 . . . 63 |
| 7 | ±64 . . . 127 |
| 8 | ±128 . . . ±255 |

In one embodiment, insignifigance identifies bits which occur before the first "one " bit after the sign bit in each pixel. In an alternate embodiment, insignificance may be based on thresholds, such as those discussed below.

The output of binarize block 1105 comprises a bit 1107 and is coupled to history block 1106 is optional, generating context bin 1108, and will be discussed below.

In one embodiment, magnitudes are coded with a four bit number (an exponent) which is the base 2 logarithm of the magnitude. This requires only three or four entropy coding operations and eight context bins for the magnitude. The eight context bins are needed for the "zero-order" information that associates a unique probability estimate for each possible magnitude.

Because many of bits used to specify the sign and the mantissa are close to 50% probability (uniformly random), there is little advantage to entropy coding these bits. (The most significant bit of the mantissa is the only bit that may be worth coding in some systems. Using one context bin for this bit and eight for the magnitude for a total of nine context bins and five coding operations might be a good system.) The uncoded sign and mantissa bits can be provided by shifting logic.

FIG. 12 illustrates a block diagram of a parallel coder chip for predictive coding that includes shifting logic. The parallel coder chip of the present invention performs parallel coding. One embodiment of an high speed parallel coding chip is described in U.S. Pat. No. 5,381,145, entitled "Method and Apparatus For Parallel Decoding and Encoding of Data", issued Jan. 10, 1995, and assigned to the corporate assignee of the present invention.

Referring to FIG. 12, during compression, input pixels are received by an input pixel interface 1201 and are supplied to a control model(s) 1202 which, using workspace data, provides contexts to a parallel entropy coder 1206. Coder 1206 generates compressed data. The compressed data manager 1207 determines which compressed data is output to a channel or memory as described above. An optional "no code" path 1205 that allows data to go uncoded to the compressed data manager 1207 for output.

During decompression, the data manager 1207 receives compressed data from a channel or memory. Context model (s) 1202, using the workspace data, provides contexts to the parallel entropy coder 1206 which decodes the compressed data. The decompressed data is output through the output pixel interface 1203. Note that if the data is not compressed, it may be sent through the optional "no code" path 1205.

One embodiment of an embedding scheme is shown in FIG. 13, where the first "1" bit in each coefficient is identified by 2 to the number coded minus one. Note that the sign bit is still coded prior to the mantissa bits. The notation "sign/magnitude bit(s)" indicates that the sign bit is coded before the most significant bit of the (variable length) mantissa. For example, if the magnitude is 3, mantissa (tail) bits 0 and 1 must be coded and the sign bit is coded in the position assigned to bit 2 of the mantissa. For another example, when the magnitude is 0, no sign or mantissa bits are coded.

So the data can be decoded in a reduced the number of operations, bits 6 . . . 4 of the sign/mantissa (if present) are provided by a single shift operation. Bits 3 . . . 0 of the sign/mantissa can be provided by low hardware cost shift-by-one or hold shift registers. Low accuracy pixel magnitude bits 1 . . . 0 are assigned to either importance level 1 or level 3, depending on whether magnitude bit 2 is 1 or 0, respectively. (See FIG. 13) The quantization ability of the embedding scheme is summarized in Table 2.

TABLE 2

| Importance levels kept | Quantization of high-accuracy pixels | Quantization of low-accuracy pixels |
|---|---|---|
| 0 | ±1 | unconstrained |
| 0,1 | ±1 | ±8 |
| 0,1,2 | ±1 | ±8 or ±4 |
| 0,1,2,3 | ±1 | ±4 |
| 0,1,2,3,4 | ±1 | ±2 |
| 0,1,2,3,4,5 | lossless | ±2 |
| 0,1,2,3,4,5,6 | lossless | ±1 |
| 0,1,2,3,4,5,6,7 | lossless | lossless |

In addition to specifying an embedding scheme, the context model of the present invention provides context bins for magnitude bits. For nine possible magnitudes, eight context bins (as mentioned above) are sufficient to keep track of the required nine probabilities (since probabilities sum to one). Using only eight context bins provides "zero order" coding of magnitudes. Each magnitude is coded independently of its neighbors under a zero order model. (The neighbors are used for prediction only). Higher order coding can be used so that neighborhood information is used for both prediction and coding. History block 1106 in FIG. 11A provides this neighborhood information. The advantage of neighborhood information is that different probability estimates can be used for smooth regions than those used at edges, which allows better compression.

Neighborhood information may be the decoded magnitude bits of the pixels used as predictors. All three magnitude bits of one or perhaps two pixels can be used. Alternatively, only one or two bits per pixel can be used. For example, a single bit per pixel can indicate if its magnitude is the same as the current magnitude being decoded. Other choices for neighborhood information include the magnitude of the absolute value of the difference between the two pixels used as a predictor.

One advantage of embedded predictive coding techniques of the present invention is that it is easy to inject constrained noise in the reconstruction during lossy (including near-lossless) decoding. The purpose of injecting noise is to reduce "banding" or "contouring" artifacts (rendering smooth regions of an image with visible discrete regions of differing intensities). Injecting noise is a dithering function and might increase quality both for direct printing and printing following a true dithering or halftoning operation.

For example, if a prediction error is constrained to be +8, +9, +10 or +11, one of these four choices might be chosen at random. (Choosing at random could be either from a uniform or distribution or a part of a Laplacian distribution). Since coded data should be close to 50% random data if good compression is achieved, it can be used as a source of random bits. Even if the coded data is not exactly 50% random, because there is a lot of it and it is not periodic, it may be a better source than a pseudo-random number generator. And, of course, there is little additional hardware cost.

ONE EMBODIMENT OF THE PRESENT INVENTION

The present invention may be performed by processing logic. The processing logic may be software running on a computer system or multi-purpose machine and/or specially designed hardware.

Encoding

One embodiment of the encoding process of the present invention is performed according to the following pseudo code:

```
For each pixel in image
    decorrelate based on causal data (e.g., prediction,
    Gray coding, . . .) (optional)
    binarize
    for each bit in binarization
        generate context: condition bit on causal information
        determine importance level of bit
        entropy code (or optionally, output without coding)
        output any coded data created to a coded data manager
```

This encoding process is illustrated by a flowchart in FIG. 14. Note than the order of processing pixels may be raster order. The processing may also be performed on 2×2 locks with blocks in raster order (e.g., one pixel each of phases 0, 1, 2 and 3 in sequence).

Decoding

One embodiment of the decoding process of the present invention is represented by the following pseudo code:

```
For each pixel in image
    for each bit in binarization
        generate context: condition bit on casual information
        determine importance level of bit
        fetch any coded data needed from the coded data manager,
        entropy decode (or optionally, output without coding)
        if (not lossless)
            reconstruct
        inverse binarize
        inverse decorrelate based on casual data (optional)
```

This decoding process is illustrated by the flowchart in FIG. 15. Note that the order of processing pixels may be raster order. In one embodiment, pixels may be processed in 2×2 blocks with blocks in raster order (e.g., one pixel each of phases 0, 1, 2 and 3 in sequence).

Decorrelate and Inverse Decorrelate

One embodiment of the decorrelate and inverse decorrelate process of the present invention is performed using gray-coding. In another embodiment, the present invention does not perform decorrelation. When predictive coding is used, the decorrelate and inverse decorrelate process may be performed according to the following pseudo code:

```
if (phase == 0)
    prediction = (north + west)/2
else if (phase == 1)
    prediction = (northwest + northeast + southwest + southeast)/4
```

```
else if (phase == 2)
    prediction = (north + south)/2
else /* phase == 3 */
    prediction = (east + west)/2
if (encoding)
    decorrelated value = pixel − prediction
else
    decorrelated value = pixel + prediction
where
    north is the phase 0 pixel to the north (above)
    west is the phase 0 pixel to the west (left)
    south is the phase 0 pixel to the south (below)
    east is the phase 0 pixel to the east (right)
    northwest is the phase 0 pixel to the northwest (above and left)
    northeast is the phase 0 pixel to the northeast (above and right)
    southwest is the phase 0 pixel to the southwest (below and left)
    southeast is the phase 0 pixel to the southeast (below and right)
```

Note that in this embodiment, the north, south, east, west, northwest, southwest, northeast, southeast refers to locations of pixels, with respect to the current pixel, used in the prediction. This decorrelate and inverse decorrelate process of the present invention is illustrated by the flowchart in FIG. 16.

In one embodiment, the pixel value associated with the boundary (when its value is needed for prediction) is 0. In an alternate embodiment, the pixel values associated with the boundary are the same values as below the pixel undergoing prediction in the same manner as if a mirror were placed and running through the pixel undergoing prediction. Decorrelated values are optionally saved for use in conditioning (bucketing).

Binarization

In the present invention, where performing bit plane coding, binarization is optional because the bits of the pixels may be used themselves. For predictive coding, one embodiment is as follows, assume 8 bit pixels and "avalue" is the absolute value of the decorrelated value. One embodiment of the binarization process is performed according to the following pseudo code:

```
if (avalue < 1)
    category = 0
    num_category_bits = 4
    num_extra_bits = 0
    start = 0
else if (avalue < 2)
    category = 1
    num_category_bits = 4
    num_extra_bits = 0
    start = 1
else if (avalue < 4)
    category = 2
    num_category_bits = 4
    num_extra_bits = 1
    start = 2
else if (avalue < 8)
    category = 3
    num_category_bits = 4
    num_extra_bits = 2
    start = 4
else if (avalue < 12)
    category = 4
    num_category_bits = 4
    num_extra_bits = 2
    start = 8
else if (avalue < 20)
    category = 5
    num_category_bits = 4
    num_extra_bits = 3
```

```
        start = 12
    else if (avalue < 36)
        category = 6
        num_category_bits = 4
        num_extra_bits = 4
        start = 20
    else if (avalue < 68)
        category = 7
        num_category_bits = 4
        num_extra_bits = 5
        start = 36
    else if (avalue < 132)
        category = 8
        num_category_bits = 2
        num_extra_bits = 6
        start = 68
    else    category = 9
        num_category_bits = 2
        num_extra_bits = 7
        start = 132
    extra_bits = value − start;
```

In this embodiment, the variable referred to as num_category_bits describes the number of bits to describe the category of the magnitude, the variable referred to as num_extra_bits describes the extra_bits and the 1 bit describes the sign. This binarization process is shown in the flowchart of FIGS. 17A and 17B. The category is threshold based. Note that the number of category bits may be variable. The number of extra bits refers to the number of bits in the tail, including the sign. In an alternative embodiment, the number of category bits may be 4 for category 6, 7, 8 and 9; and 3 for all the other categories.

Start is the start of the interval that corresponds to that value, where the value is determined by adding the start value to the number of extra bits. The start value is determined according to the equation: start[category N+1] =start [category N] $+2^{num\_extra\_bits}$. The comparison values are start for the next category. More categories or more extra bits per category could be used for pixels larger than 8 bits. Fewer categories or fewer extra bits per category could be used for pixels smaller than 8 bits.

The inverse binarization follows from the forward. The category is used to determine the start of interval and the number of extra bits. The start value is added to the value specified by the extra bits. Then the sign bit is used to give the proper sign to the value.

Generating Contexts

The present invention generates contexts for each pixel. In one embodiment, when performing bitplane coding, templates are used to generate contexts for each phase. In an alternate embodiment performing predictive coding with nine buckets, the north, south, etc. are phase 0 decorrelated values (actually, just the category is needed in some embodiments).

In one embodiment, the context that generated according to the following pseudo code. The four category bits are bit [3] . . . bit [0] where bit [3] is the MSB and is coded first.

```
if (phase == 0)
    condition = bucket (north) * 8 + bucket (west)
else if (phase == 1)
    condition = bucket (northwest) * 8 + bucket (southeast)
else if (phase == 2)
    condition = bucket (north) * 8 + bucket (south)
else /* phase == 3 */
```

```
    condition = bucket (east) * 8 + bucket (west)
if (bit [3] == 1)
    zero_order = bit [2[ * 8;
else if (bit [2] == 1)
    zero_order = 1;
else if (bit [1] == 1)
    zero_order = 2 + bit [2]
else
    zero_order = 4 + 2 * bit [2] + bit [1]
context = condition * 9 + zero_order
```

This pseudo code is illustrated in the flow chart in FIG. 18.

Bucket

Bucketing is known in the art. For more information on "bucketing", see Langdon et al., "Context-dependent Distribution Shaping and Parameterization For Lossless Image Compression", SPIE, Applications of Digital Image Processing XVII vol. 2298, Jul. 26–29 1994, San Diego, Calif.; Pennebaker et al., JPEG Still Image Data Compression Standard, (Van Nostrand Reinhold, N.Y. 1993), pg. 208; and International Standard Dis 10918-1, CCITT Recommendation T.81, entitled Digital Compression and Coding of Continuous-Tone Still Images, pg. 457, commonly referred to as "JPEG". By running the prediction error through a bucket function, a value is received that is used for the context.

One embodiment of the bucket procedure of the present invention is performed according to the following in which the variable "value" refers to the decorrelated value (and "avalue" is the absolute value of "value"):

```
if (value <= −12)
        bucket = 0
else if (value <= −8)
        bucket = 1
else if (value < 0)
        bucket = 2
else if (value < 8)
        bucket = 3
else if (value < 12)
        bucket = 4
else
        bucket = 5
```

The bucket procedure above is illustrated in the flow chart in FIG. 19.

Note that other thresholds can be chosen. Note that it is convenient to chose thresholds such that comparison of categories can be performed equivalently, since this is desirable in some embodiments.

Determine Importance Level

In one embodiment, for bitplane coding of 8-bit data, the importance level may be determined according to the following:

if (phase=0)
        importance level=7-bitplane
    else
        importance level=15-bitplane The process for determining the importance level described above is shown in the flow chart in FIG. 20A.

In one embodiment, for predictive coding, the importance level may be determined accordig to the following:

```
if (phase 0)
        importance = 0
else (bit is a category bit 3 or category bit 2)
        importance level = 1
else if (bit is a category bit 1)
        if (category >= 4)
                importance level = 2
        else
                importance level = 5
else if (bit is a category bit 0)
        if (category >= 6)
                importance level = 3
        else if (category >= 4)
                importance level = 4
        else if (category >= 2)
                importance level = 6
        else
                importance level = 7
else if (bit is an extra bit)
        if (bit is extra bit 6)
                importance level = 1
        if (bit is extra bit 5)
                importance level = 2
        if (bit is extra bit 4)
                importance level = 3
        if (bit is extra bit 3)
                importance level = 4
        if (bit is extra bit 2)
                importance level = 5
        if (bit is extra bit 1)
                importance level = 6
        if (bit is extra bit 0)
                importance level = 7
else /* (bit is a sign bit) */
        if (category >= 4)
                importance level = 1
        else if (category >= 2)
                importance level = 5
        else
                importance level = 7
```

The process for determining the importance level above is shown in FIGS. 20B through 20D.

Reconstruction

In the present invention, reconstruction is used to adjust the binarization when all bits of the binarization are not known.

In one embodiment, for bitplane coding, reconstruction is performed according to the following:

```
interpolate estimate for current pixel
if (estimate is in valid range)
        reconstruction = estimate
else if (estimate > maximum value in valid range)
        reconstruction = maximum value in valid range given
        known bits
        set unknown bits to one
else
        reconstruction = minimum value in valid range given
        known bits
        set unknown bits to zero
```

In one embodiment, the valid range is 0–255, which is known by both the encoder and the decoder. The process for reconstruction described above is shown in FIG. 21A. It should be noted that interpolation can use the decorrelator for prediction.

For predictive coding, reconstruction occurs to the middle of smaller intervals, but if an interval is large, reconstruct closer to zero to better model Lapacian distributions. In one embodiment, for predictive coding, reconstruction is performed according to the following:

```
if (sign of value unknown)
        reconstruction = 0
else
        min = valid reconstruction value closest to zero
        max = valid reconstruction value furthest from zero
        amin = absolute value of valid reconstruction value closest to zero
        amax = absolute value of reconstruction value furthest from zero
        if ((amax + amin)/2 <= 2 * amin)
                reconstruction = (min + max)/2
        else if (min > 0)
                reconstruction = 2 * min - 1
        else /* min < 0 */
                reconstruction = 2 * min + 1
```

The process for performing reconstruction for predictive is shown in FIG. 21B.

Fixed Size Data Manager (Encoding)

The fixed size data manager for encoding stores data in a limited size memory or storage area. As the data is received from the encoder, the data manager determines if space is available in a currently allocated segment of memory for the coded data based on its importance. If space is available, it stores the coded data. If there is no space available but there are unused segments not yet allocated, the data manager allocates a new segment in the memory based on its importance level. If there are no unused segments and the importance level is such that less important is already stored in the memory, the less important data is overwritten by this new data. It should be noted that when the data manager is not receiving data, it is waiting for data from the encoder. This process performed by the data manager is represented by the following pseudo code.

```
initialize
do
        if data received from encoder
                if (space available for coded data of importance received)
                        stored coded data
                else
                        allocate new segment
                        if (allocation successful)
                                store coded data
                        else
                                wait
while (not end of coded data)
```

The operation of the fixed size data manager, as described above is shown in a flow chart in FIG. 22.

In one embodiment, an entire memory is used to store coded data. In one embodiment, a portion of a memory is used from a "start" location to an "end" location. In one embodiment, the "start" and "end" locations may remain fixed for multiple compression/decompression operations. In one embodiment, after all of the compressed data has been compressed/decompressed, the "start" location is moved to a new location after the "end" location and the "end" location is moved a specified distance from the "start" location. A circular addressing method may be used. An example of this type of system is described in conjunction with FIGS. 24 and 25.

It should be noted that for the fixed size data manager to perform during encoding, it must first initialize a pointer referred to herein as the free pointer to the next available segment in memory not already containing data. A pointer to each importance level must be also initialized as well as the level of quantization that is to be performed. Note that initially the quantization level is initialized to "none". As memory fills up, the encoder increases the quantization level one level at a time. When decoding, the quantization level may be transmitted or each segment of memory may indicate its importance level.

Note that the wait step may not be necessary in some embodiments, such as when using a general purpose computer.

Fixed Size Data Manager (Decoding)

During decoding, the fixed size data manager responds to requests from the decoder. If the decoder requests the data for an importance level that has been quantized, the data manager indicates to the decoder that there is no data available. If the data requested by the decoder is not in an importance level that has been quantized, the data manager determines if there is data available in the current segment corresponding to the importance level requested and, if so, returns the coded data. If there is no data available in the current segment, the data manager determines if there are any more segments allocated having the importance level that is requested by the decoder and using a pointer, goes to such a segment if one exists. Once at that segment, the data manager returns the coded data. Otherwise, the data manager indicates, via one or more signals, to the decoder that there is no data available. The operation of the data manager, during decoding, may be represented by the following pseudo code.

```
initialize
do
        if data requested by decoder
        if (importance level quantizied)
                return "no data available"
        else if (data available in current segment for coded data of
                            importance requested)
                return coded data
        else if (more segments allocated to importance requested)
                go to next segment using next pointer
                return coded data
        else
                return "no data available"
    else
        wait
while (not end of decoding)
```

The above operation of the fixed size data manager is illustrated in a flow chart in FIG. 23.

A pointer to each importance level must be also initialized as well as the level of quantization that is to be performed. Note that the wait state may not be necessary in some embodiments.

Fixed Rate Data Manager (Encoding)

During encoding, a fixed rate data manager determines which data from the encoder is to be sent on the limited bandwidth channel. Matching the limited bandwidth of the channel is based on choosing a packet size that is the amount of data the channel can transmit during the time allocated to the data being compressed/decompressed. A buffer in memory of this packet size is managed to achieve the desired bandwidth. The packet size may be constant or may vary based on whether the channel bandwidth is constant or varies.

In one embodiment, the fixed rata data manager outputs a packet of compressed data at the location specified by a channel pointer and increments the channel pointer by the packet size. This occurs until the channel pointer reaches the start of the buffer. During this time, the fixed rate data manager employs the fixed size data manager for storing data between the start and the end of the buffer. The operation of the fixed rate data manager is represented by the following pseudo code.

```
initialize
set "start pointer" to start of buffer
set "channel pointer" to start of buffer
set "end pointer" to desired part of buffer to achieve limited rate
do
    if (start pointer >= channel pointer + packet size)
        output packet of compressed data at channel pointer
        increment channel pointer by packet size
    use fixed size data manager (encoding) for memory between start
    and end
    set start pointer to end of memory used
    set end pointer to input start pointer + desired amount to
                    achieve limited rate
while (still coded data left to transmit)
```

The above pseudo code is represented as a flow chart in FIG. 24.

Note that a circular buffer is assumed. The output steps (1115, 1120, 1125) and the input steps (1130, 1135, 1140) can be done in parallel.

Fixed Rate Data Manager (Decoding)

During decoding, the fixed rate data manager initially determines if there is space in a buffer for a packet and, if so, reads the packet of compressed data at the channel pointer and increments the channel pointer by the packet size. Then, using the fixed size data manager, the decoder obtains data from the buffer. The operation of the fixed rate data manager operates according to the following pseudo code.

```
initialize
set "start pointer" to start of buffer
set "channel pointer" to start of buffer
set "end pointer" to part of buffer to match limited rate
do
    if (space in buffer for a packet)
        read packet of compressed data at channel pointer
        increment channel pointer by packet size
    use fixed size data manager (decoding) for memory between start
    and end
    set start pointer to end of memory used
    set end pointer to input starter pointer + amount to match
            limited rate
while (not end of decoding)
```

The above pseudo code is illustrated in the flow chart in FIG. 25.

In one embodiment, a circular buffer is used. Space is available in the buffer for a packet when in buffer channel pointer + packet size is less than the start pointer, given the appropriate circular addressing computation. The output steps (1230, 1235, 1240) and the input steps (1215, 1220, 1225) can be done in parallel. In other words, assuming the memory is filled with data for decoding, the operations can be done in parallel assuming that memory space that remains available is large enough to store the next fixed size packet.

Allocate New Segment

During encoding and decoding with the fixed size data manager, new segments of memory are allocated. In one embodiment, new segments are allocated by overwriting less important data with more important data. The new segment allocated is typically the least important data that is currently stored in the buffer. One embodiment of the process for allocating the new segment is illustrated by the following pseudo code.

```
if (memory not full)
    allocate segment at free pointer
    if (previous segment)
        save pointer to segment at free pointer in previous segment
        (optional) clear "next pointer" in segment.
    increment free pointer
else
    if (importance level of data is more important than least important
         data in memory)
        reallocate a page of least important data for current data
        if (free pointer is at end of memory)
            set free pointer to start of least important data
            set quantization to least important data
        allocate segment at free pointer
        if "next pointer" for allocated segment is clear
            set free pointer to start of next least important data
            set quantization to next least important data
        else
            set free pointer to "next pointer"
    else
        return "allocation failed"
```

This process of allocating the new segment is described above as shown in FIGS. 26A and 26B.

The memory is defined as "not full" to handle fixed rate cases by indicating that all the space between "start" and "end" is not full. In one embodiment, when allocating a new segment of memory as memory already containing data, the entire memory area containing the data may be reallocated or only that portion necessary to accomodate the extra data. Doubly linked lists may be used to allow for partial use of least important level in such cases.

Note that connections for normal operation is shown in FIG. 2. Connections needed for updating the pointers at the end of a coding unit are not shown. In one embodiment, a control signal (not shown) from the decoder to the data manager is used to indicate that the decoder is finished with an importance level.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

Thus, a compression/decompression system has been described.

We claim:

1. A system comprising:
    a one-pass spatially embedded compressor that compresses first image data into compressed data, wherein the compressor comprises
        an encoder having a spatially embedded context model, wherein the encoder operates in the spatial domain to encode first image data, and
        a coded data manager, coupled to the encoder, that determines which portion of the compressed data to forward based on available channel bandwidth; and
    a resource coupled to the compressor to transmit the compressed data.

2. The system defined in claim 1 wherein the resource comprises a limited bandwidth channel.

3. A system comprising:
    a one-pass spatially embedded compressor to compress first image data into compressed data, wherein the compressor comprises
        an encoder, and
        a coded data manager, coupled to the encoder, to determine which portion of the compressed data to forward based on available channel bandwidth;
    a resource coupled to the compressor to transmit the compressed data;
    a channel coupled to the resource; and
    a spatially embedded decompressor coupled to the channel to decompress the compressed data into second image data.

4. The system defined in claim 3 wherein the decompressor comprises:
    a coded data manager; and
    a decoder coupled to the coded data manager.

5. A one-pass spatially embedded compressor to compress first image data into compressed data, the compressor comprising
    an encoder to perform one-pass spatially embedded coding, and
    a coded data manager, coupled to the encoder, to determine which portion of the compressed data to forward based on available channel bandwidth, wherein the coded data manager quantizes compressed data based on channel bandwidth.

6. A one-pass spatially embedded compressor to compress first image data into compressed data, the compressor comprising:
    an encoder having a spatially embedded context model to perform resolution reduction to obtain a low resolution, high-accuracy image and high resolution, low-accuracy image, and
    a coded data manager, coupled to the encoder, to determine which portion of the compressed data to forward based on available channel bandwidth.

7. The compressor defined in claim 6 wherein the context model performs resolution reduction by subsampling.

8. The compressor defined in claim 6 wherein the context model performs resolution reduction using two dimensional subsampling.

9. The compressor defined in claim 6 wherein the context model generates contexts using bitplane templates.

10. A one-pass spatially embedded compressor to compress first image data into compressed data, the compressor comprising:
    an encoder having a spatially embedded context model to perform predictive coding, and
    a coded data manager, coupled to the encoder, to determine which portion of the compressed data to forward based on available channel bandwidth.

11. The compressor defined in claim 10 wherein the encoder codes prediction errors from the context model.

12. The compressor defined in claim 11 wherein the context model performs prediction using interpolation.

13. The compressor defined in claim 6 wherein the context model performs Gray coding for bitplane coding.

14. A system comprising:
    a one-pass spatially embedded compressor that compresses first image data into compressed data, wherein the compressor comprises
        an encoder having a spatially embedded context model, wherein the encoder operates in the spatial domain to encode first image data, and
        a coded data manager, coupled to the encoder, that determines which portion of the compressed data to forward based on available storage space; and a resource coupled to the compressor to store the compressed data.

15. The system defined in claim 14 wherein the resource comprises a limited size storage.

16. A system comprising:
a one-pass spatially embedded compressor to compress first image data into compressed data, wherein the compressor comprises
an encoder, and
a coded data manager, coupled to the encoder, to determine which portion of the compressed data to forward based on available channel bandwidth;
a resource coupled to the compressor to store the compressed data; and
a spatially embedded decompressor coupled to the resource to decompress the compressed data into second image data.

17. The system defined in claim 16 wherein the decompressor comprises:
a coded data manager; and
a decoder coupled to the coded data manager.

18. A system comprising:
a one-pass spatially embedded compressor to compress first image data into compressed data, wherein the compressor comprises
an encoder, and
a coded data manager, coupled to the encoder, to determine which portion of the compressed data to forward based on available channel bandwidth, wherein the coded data manager quantizes compressed data based on the available storage size;
a resource coupled to the compressor to store the compressed data.

19. A system comprising:
a one-pass spatially embedded compressor to compress first image data into compressed data, wherein the compressor comprises
an encoder having a spatially embedded context model to perform resolution reduction to obtain a low resolution, high-accuracy image and high resolution, low-accuracy image, and
a coded data manager, coupled to the encoder, to determine which portion of the compressed data to forward based on available channel bandwidth;
a resource coupled to the compressor to store the compressed data.

20. The system defined in claim 19 wherein the context model performs resolution reduction by subsampling.

21. The system defined in claim 19 wherein the context model performs resolution reduction using two dimensional subsampling.

22. The system defined in claim 19 wherein the context model generates contexts using bitplane templates.

23. A system comprising:
a one-pass spatially embedded compressor to compress first image data into compressed data, wherein the compressor comprises
an encoder comprising a spatially embedded context model to perform predictive coding, and
a coded data manager, coupled to the encoder, to determine which portion of the compressed data to forward based on available channel bandwidth;
a resource coupled to the compressor to store the compressed data.

24. The system defined in claim 23 wherein the encoder codes prediction errors from the context model.

25. The system defined in claim 24 wherein the context model performs prediction using interpolation.

26. The system defined in claim 19 wherein the context model performs Gray coding for bitplane coding.

27. A process for encoding data comprising the steps of:
performing binarization to convert a pixel into binary;
for each bit in the binarization,
generating contexts for said each bit by conditioning said each bit on causal information;
determining an importance level for said each bit;
separating said each bit based on importance levels;
entropy coding said each bit based on the importance level; and
outputting any coded data to a coded data manager.

28. A process for encoding data comprising the steps of:
decorrelating a pixel based on causal data prior to binarizing;
performing binarization to convert the pixel into binary;
for each bit in the binarization,
generating contexts for said each bit by conditioning said each bit on causal information;
determining an importance level for said each bit;
separating said each bit based on importance levels;
entropy coding said each bit; and
outputting any coded data to a coded data manager.

29. The process defined in claim 28 wherein the step of decorrelating comprises performing Gray coding on the pixel.

30. The process defined in claim 28 wherein the step of decorrelating comprises generating a decorrelate value by subtracting a prediction value that is based on a current phase from the pixel value.

31. A process for encoding data comprising the steps of:
performing binarization to convert a pixel into binary;
for each bit in the binarization,
generating contexts for said each bit by conditioning said each bit on causal information, wherein the step of generating contexts comprises performing bucketing;
determining an importance level for said each bit;
separating said each bit based on importance levels;
entropy coding said each bit; and
outputting any coded data to a coded data manager.

32. A process for encoding data comprising the steps of:
performing binarization to convert a pixel into binary;
for each bit in the binarization,
generating contexts for said each bit by conditioning said each bit on causal information;
determining an importance level for said each bit, wherein the importance level of said each bit is determined according to its bitplane;
separating said each bit based on importance levels;
entropy coding said each bit; and
outputting any coded data to a coded data manager.

33. A process for encoding data comprising the steps of:
performing binarization to convert a pixel into binary;
for each bit in the binarization,
generating contexts for said each bit by conditioning said each bit on causal information;
determining an importance level for said each bit, data wherein the importance level of said each bit is determined according to its category, phase, extra bits and sign;
separating said each bit based on importance levels;
entropy coding said each bit; and
outputting any coded data to a coded manager.

34. A process for encoding data comprising the steps of:
performing binarization to convert a pixel into binary;
for each bit in the binarization,
  generating contexts for said each bit by conditioning said each bit on causal information, wherein the step of generating contexts comprises performing bucketing;
  determining an importance level for said each bit;
  separating said each bit based on importance levels;
  entropy coding said each bit;
  outputting any coded data to a coded
data manager receiving coded data; and
as data is being received by the data manager,
  determining if space is available in a currently allocated segment of the storage area for the coded data of the importance level;
  storing the coded data if space is available;
  allocating a new segment in the storage area if space is not available in the currently allocated segment and an unused segment not yet allocated is available in the storage area and storing the coded data in the new segment,
  overwriting less important data in a previously allocated segment of the storage area if no unused segments exist in the storage area and less important data is already stored therein.

35. The process defined in claim 34 wherein the new segment is allocated based on importance level.

36. The process defined in claim 35 further comprising the step of a data manager transmitting data in the storage area when full.

37. A process for encoding data comprising the steps of:
performing binarization to convert a pixel into binary;
for each bit in the binarization,
  generating contexts for said each bit by conditioning said each bit on causal information, wherein the step of generating contexts comprises performing bucketing;
  determining an importance level for said each bit;
  separating said each bit based on importance levels;
  entropy coding said each bit; and
  outputting any coded data to a coded data
a fixed-rate data manager determining which of the coded data is to be sent on a limited bandwidth channel.

38. The process defined in claim 37 further comprising the step of choosing a packet size.

39. The process defined in claim 38 wherein the packet size is variable.

40. The process defined in claim 37 further comprising the steps of the data manager outputting a packet of compressed data at a location specified by a channel pointer and incrementing the channel pointer by the packet size.

41. A process for decoding data comprising the steps of:
(a) generating a context, using a spatially embedded context model for each bit in a binarization by conditioning said each bit on causal information;
(b) determine an importance level for said each bit;
(c) fetching any coded data needed from a coded data manager;
(d) entropy decoding at least one of said each bit to produce decompressed data based on importance level; and
(e) performing inverse binarization on the decompressed data to obtain a pixel.

42. A process for decoding data comprising the steps of:
(a) generating a context for each bit in a binarization by conditioning said each bit on causal information;
(b) determining an importance level for said each bit;
(c) fetching any coded data needed from a coded data manager
(d) entropy decoding at least one of said each bit to produce decompressed data based on importance level;
(e) performing inverse binarization on the decompressed data to obtain a pixel; and
repeating steps (a)–(e) for each pixel in an image.

43. A process for decoding data comprising the steps of:
a decoder requesting data for an importance level;
a data manager indicating to the decoder that no data is available if the importance level has been quantized;
the data manager determining if data is available in a current segment corresponding to the importance level requested and, if so, provides data to the decoder; and
the data manager determining if any other allocated segments exist that have data of the importance level requested and, if so, providing the data to the decoder
generating a context for each bit in a binarization by conditioning said each bit on causal information;
determining an importance level for said each bit;
fetching any coded data needed from a coded data manager
entropy decoding at least one of said each bit to produce decompressed data based on importance level;
performing inverse binarization on the decompressed data to obtain a pixel.

44. The processor defined in claim 43 further comprising the step of the data manager indicating to the decoder that no data is available if no other allocated segment exists containing data of the importance level requested.

45. A process for decoding data comprising the steps of:
(a) generating a context for each bit in a binarization by conditioning said each bit on causal information;
(b) determining an importance level for said each bit;
(c) fetching any coded data needed from a coded data manager
(d) entropy decoding at least one of said each bit to produce decompressed data based on importance level;
(e) performing inverse binarization on the decompressed data to obtain a pixel; and
(f) performing inverse decorrelation based on causal data after inverse binarization.

46. The decoding process defined in claim 45 wherein the step of decorrelating comprises generating a decorrelate value being the pixel value plus a prediction value that is based on a current phase.

47. A process for decoding data comprising the steps of:
(a) generating a context for each bit in a binarization by conditioning said each bit on causal information;
(b) determining an importance level for said each bit;
(c) fetching any coded data needed from a coded data manager
(d) entropy decoding at least one of said each bit to produce decompressed data based on importance level;
(e) performing inverse binarization on the decompressed data to obtain a pixel; and
(f) reconstructing values if not lossless.

48. The decoding process defined in claim 47 wherein the step of reconstructing values comprises performing interpolation.

49. An apparatus comprising:

an encoder to perform spatially embedded coding on pixel data;

a coded data manager that controls disposition of compressed data from the encoder, such that the encoder and coded data manager form a one-pass spatially embedded compressor.

50. The apparatus defined in claim 49 wherein the coded data manager determins which portion of the compressed data to forward based on available channel size.

51. An apparatus comprising:

an encoder;

a coded data manager to control disposition of compressed data from the encoder, such that the encoder and coded data manager form a one-pass spatially embedded compressor, wherein the coded data manager determines which portion of the compressed data to forward based on available memory size.

52. An apparatus for decoding data comprising:

means for generating a context for each bit in a binarization by conditioning said each bit on causal information;

means for determining an importance level for said each bit;

means for fetching any coded data needed from a coded data manager means for entropy decoding at least one of said each bit to produce decompressed data based on importance level;

means for performing inverse binarization on the decompressed data to obtain a pixel; and wherein the means for generating, means for determining, means for fetching, means for entropy decoding and means for performing inverse binarization operate on each pixel in an image to generate pixel data.

53. An apparatus for encoding data comprising:

means for decorrelating a pixel based on causal data prior to binarizing means for performing binarization to convert the pixel into binary;

means for generating contexts for said each bit by conditioning said each bit on causal information;

means for determining an importance level for said each bit;

means for separating said each bit based on importance levels;

means for entropy coding said each bit; and means for outputting any coded data to a coded data manager, wherein the means for generating, means for determining, means for separating, means for entropy coding and means for outputting operate on each bit in the linearization.

* * * * *